US008364881B2

(12) United States Patent
Urabe

(10) Patent No.: US 8,364,881 B2
(45) Date of Patent: Jan. 29, 2013

(54) FLASH MEMORY CONTROLLER AND METHODS OF PROGRAMMING AND READING FLASH MEMORY DEVICES USING THE CONTROLLER

(75) Inventor: Masayuki Urabe, Isehara (JP)

(73) Assignee: Marvell World Trade Ltd., St. Michael (BB)

( * ) Notice: Subject to any disclaimer, the term of this patent is extended or adjusted under 35 U.S.C. 154(b) by 585 days.

(21) Appl. No.: 11/866,167

(22) Filed: Oct. 2, 2007

(65) Prior Publication Data
US 2008/0086589 A1 Apr. 10, 2008

Related U.S. Application Data

(60) Provisional application No. 60/828,144, filed on Oct. 4, 2006.

(51) Int. Cl.
*G06F 12/00* (2006.01)
(52) U.S. Cl. .................. 711/5; 711/2; 711/103
(58) Field of Classification Search .................. 711/103, 711/2, 5, 101, 102, 104
See application file for complete search history.

(56) References Cited

U.S. PATENT DOCUMENTS

| | | | | |
|---|---|---|---|---|
| 5,822,550 | A * | 10/1998 | Milhaupt et al. | 710/315 |
| 6,021,459 | A | 2/2000 | Norman et al. | |
| 6,034,878 | A * | 3/2000 | Osaka et al. | 365/52 |
| 6,253,277 | B1 * | 6/2001 | Lakhani et al. | 711/5 |
| 6,393,541 | B1 * | 5/2002 | Fujii | 711/167 |
| 6,658,509 | B1 * | 12/2003 | Bonella et al. | 710/100 |
| 7,126,873 | B2 * | 10/2006 | See et al. | 365/230.06 |
| 7,263,591 | B2 * | 8/2007 | Estakhri et al. | 711/168 |
| 7,328,295 | B2 * | 2/2008 | Yiu et al. | 710/264 |
| 7,712,131 | B1 * | 5/2010 | Lethe | 726/20 |
| 2004/0107326 | A1 * | 6/2004 | Janzen et al. | 711/167 |
| 2004/0148482 | A1 * | 7/2004 | Grundy et al. | 711/167 |
| 2004/0153601 | A1 * | 8/2004 | Blankenagel | 711/103 |
| 2004/0168014 | A1 * | 8/2004 | Lofgren et al. | 711/103 |
| 2004/0172581 | A1 * | 9/2004 | Tamura et al. | 714/718 |
| 2005/0286284 | A1 | 12/2005 | See et al. | |
| 2007/0234004 | A1 * | 10/2007 | Oshima et al. | 711/202 |

OTHER PUBLICATIONS

PCT International Preliminary Report; International Application No. PCT/IB2007/004473; Filing Date: Feb. 10, 2007; 2 pages; International Bureau of WIPO, Switzerland.
PCT Written Opinion of the International Searching Authority; International Application No. PCT/IB2007/004473; Filing Date: Feb. 10, 2007; 6 pages; International Searching Authority, European Patent Office.
PCT—International Search Report; International Appl. No. PCT/IB2007/004473; Filing Date: Feb. 10, 2007; 4 pages; International Search Authority—European Patent Office.
PCT—Written Opinion of the International Search Authority; International Appl. No. PCT/IB2007/004473; Filing Date: Feb. 10, 2007; 6 pages; International Search Authority—European Patent Office.
CF+ and CompactFlash Specification Revision 2.0; XP-002360925; May 2003; pp. 1-125; CompactFlash Association; Palo Alto, CA.

* cited by examiner

*Primary Examiner* — Jared Rutz
*Assistant Examiner* — Gurtej Bansal

(57) ABSTRACT

A system including a plurality of NAND flash memory devices each having a NAND flash interface, where the NAND flash interface of each NAND flash memory device includes an 8-bit data bus, and a memory controller configured to exchange data with the plurality of NAND flash memory devices via the 8-bit data bus. The memory controller is further configured to select a first NAND flash memory device of the plurality of NAND flash memory devices, without using a Chip Enable signal of the NAND flash interface, by transmitting, on the 8-bit data bus, an identification byte identifying the first NAND flash memory device. The memory controller is further configured to transmit, on the 8-bit data bus, a command byte to the first NAND flash memory device. The first NAND flash memory device is configured to perform an operation indicated by the command byte.

12 Claims, 22 Drawing Sheets

FLASH MEMORY CONTROLLER AND METHODS OF PROGRAMMING AND READING FLASH MEMORY DEVICES USING THE CONTROLLER

RELATED APPLICATION(S)

This application claims the benefit of U.S. Provisional Application No. 60/828,144, filed on Oct. 4, 2006, incorporated herein by reference in its entirety.

FIELD OF THE INVENTION

The present invention generally relates to the field of flash memory devices, interfaces and architectures. More specifically, embodiments of the present invention pertain to an interface, arrangement, and method for controlling flash memory devices.

BACKGROUND

Memory devices, such as flash electrically erasable programmable read only memory (EEPROM), are becoming more widespread. For example, "jump" drives (e.g., for universal serial bus (USB) connections), memory cards, and other nonvolatile memory applications are commonplace in cameras, video games, computers, and other electronic devices. FIG. 1 shows a block diagram of a conventional memory array organization 100. For example, the memory array can be organized in bits (e.g., 8-bit depth 108), bytes (e.g., 2 kB portion 104, and 64 B portion 106), pages (e.g., 512 K pages 102, corresponding to 8192 blocks), and blocks (e.g., block 110, equal to 64 pages), forming an 8 Mb device in this particular example. Also, single page 112 can be organized as portion 114 (e.g., 2 kB+64 B=2112 B=840h), and portion 116, corresponding to an eight (8)-bit wide data input/output (I/O) path (e.g., I/O 0-I/O 7).

This type of flash memory may represent a "NAND" type, which typically has faster erase and write times, higher density, lower cost per bit, and more endurance than a "NOR" type flash memory. However a NAND flash I/O interface typically allows only sequential access to data. FIG. 2A shows a timing diagram 200 for a conventional read operation. As shown below in Table 1, various pin functions can correspond to designated pins in a NAND flash interface.

TABLE 1

| PIN | PIN FUNCTION |
| --- | --- |
| I/O[7:0] | Data in/out |
| CLE | Command latch enable |
| ALE | Address latch enable |
| CE_ | Chip enable |
| RE_ | Read enable |

TABLE 1-continued

| PIN | PIN FUNCTION |
| --- | --- |
| WE_ | Write enable |
| WP_ | Write protect |
| R/B_ | Ready/busy output |

In FIG. 2A, WE_ can be pulsed (e.g., at a 25 ns period) to allow row address (e.g., RA1, RA2, and RA3) and column address (e.g., CA1 and CA2) information to be latched in the device. Command "00h" may indicate a read address input, while command "30h" may indicate a read start, as shown. With RE_ pulsing, data Dout N, Dout N+1, Dout N+2, . . . Dout M can be read from the device. Also, signal R/B_in a low logic state can indicate a busy state on the output, and R/B_ may go high some period of time after the last rising edge of WE_, for example. Row and column address multiplexing on the data in/out pins (e.g., I/O[7:0]) can be as shown below in Table 2.

TABLE 2

| CYCLE | I/O[0] | I/O[1] | I/O[2] | I/O[3] | I/O[4] | I/O[5] | I/O[6] | I/O[7] |
| --- | --- | --- | --- | --- | --- | --- | --- | --- |
| $1^{st}$ Cycle: Column Address | A0 | A1 | A2 | A3 | A4 | A5 | A6 | A7 |
| $2^{nd}$ Cycle: Column Address | A8 | A9 | A10 | A11 | L | L | L | L |
| $3^{rd}$ Cycle: Row Address | A12 | A13 | A14 | A15 | A16 | A17 | A18 | A19 |
| $4^{th}$ Cycle: Row Address | A20 | A21 | A22 | A23 | A24 | A25 | A26 | A27 |
| $5^{th}$ Cycle: Row Address | A28 | A29 | A30 | L | L | L | L | L |

For example, higher address bits can be utilized for addressing larger memory arrangements (e.g., A30 for 2 Gb, A31 for 4 Gb, A32 for 8 Gb, A33 for 16 Gb, A34 for 32 Gb, and A35 for 64 Gb).

Referring now to FIG. 2B, a timing diagram 220 shows a conventional page program operation. Here, command "80h" can indicate serial data (e.g., Din N . . . Din M) input. Command "10h" can indicate an auto program, followed by a status read (command "70h"). I/O[0]="0" can indicate no error condition, while I/O[0]="1" may indicate that an error in auto programming has occurred. Also, signal R/B_may be low, indicating a busy state, for a length of time typically on the order of hundreds of μs. Also, a rising edge of RE_can trail a rising edge of WE_by a period of time (60 ns, in one example).

FIG. 2C shows a timing diagram 240 for a conventional block erase operation. Here, command "60h" can indicate a block erase operation, with sequential row addresses (e.g., RA1, RA2, and RA3) supplied. Command "D0h" can indicate a cycle 2 block erase operation. The block erase operation can be checked by a status read (command "70h"), where I/O[0]="0" can indicate no error condition, while I/O[0]="1" may indicate that an error in block erase has occurred. Example signal times can include signal R/B_ being low for a period of time typically on the order of about a millisecond (with a predetermined maximum), a rising edge of RE_ trailing a rising edge of WE_, and a rising edge of WE corresponding to the D0h command to a falling edge of R/B_ of about 100 ns.

In conventional flash memory arrangements involving multiple chips or devices in a common package (e.g., a hybrid drive), multiple chip enable (CE_) pins may be required to access the various flash memory chips. Particularly in larger memory structures, such multiple enable pins may result in relatively complicated control logic and consume a relatively large chip area. Therefore, it would be desirable to provide a solution that is able to control access to (e.g., programming and reading) multiple flash memory chips or devices without increasing the pin count.

SUMMARY

Embodiments of the present invention pertain to an interface, arrangement, and method for controlling flash memory devices.

In one aspect, a memory controller can include a first interface configured to communicate with a host and a second interface configured to communicate with a plurality of flash memory devices, where the second interface can include a configuration terminal configured to transmit an instruction to the plurality of flash memory devices and to receive device identification information, a command control terminal configured to transmit a command timing signal to the plurality of flash memory devices, a clock terminal configured to transmit a clock signal to the plurality of flash memory devices, a read command terminal configured to receive a read command from the plurality of flash memory devices, and a first plurality of data input/output (I/O) terminals configured to transmit data to and receive data from the plurality of flash memory devices.

The memory controller may also be configured to transmit the device identification information to the plurality of flash memory devices on the first plurality of data I/O terminals within a predetermined period of time following the instruction on the configuration terminal. Additionally or alternatively, the memory controller can also include command timing logic configured to release the command timing signal at least one cycle prior to placing the first plurality of data I/O terminals in a high impedance state, and/or read logic configured to enable a read operation to read data from one of the plurality of flash memory devices in response to an active read command.

In the memory controller, the read command can include a read clock. The memory controller can also include command logic configured to transmit an operational command from the first plurality of data I/O terminals to the plurality of flash memory devices. The memory controller can also include a write protect terminal configured to transmit a write protection signal to the plurality of flash memory devices. The memory controller can also include an interrupt terminal configured to receive an interrupt signal from the plurality of flash memory devices.

The first interface of the memory controller can include: (i) a second plurality of data I/O terminals configured to transmit data to and receive data from the host; (ii) a command enable terminal configured to transmit a command timing signal to the host; (iii) an address enable terminal configured to transmit a clock signal to the host; (iv) a read enable terminal configured to receive a read command from the host; and (v) a write enable terminal configured to transmit an instruction to the host.

The first interface can also include a plurality of device enable terminals configured to identify one of the plurality of flash memory devices. Also, the first plurality of data I/O terminals can consist of a first number of I/O terminals, where the second plurality of data I/O terminals consists of a second number of I/O terminals, and the first number is an integer multiple of the second number. The first interface of the memory controller can also include a write protect terminal configured to transmit a write protection signal to the host, and a status terminal configured to receive an interrupt signal from the host.

In another aspect, a method of programming one of a plurality of flash memory devices can include initiating a programming operation, determining a status of the programming operation, determining a command status when the programming operation status indicates that the programming operation is complete or when an interrupt indicator is asserted, and determining error information when either the programming operation status or the command status indicates an error. Generally, the programming operation comprises writing data into the one of the plurality of flash memory devices or a buffer therefor, and initiating the programming operation further comprises identifying the flash memory device for the programming operation. In certain embodiments, the method further comprises repeating determining the programming operation status until the programming operation is complete, for example until an operation in progress (OIP) indicator indicates that the programming operation is complete. Alternatively or additionally, the method may further comprise clearing a buffer flag and/or writing data to the buffer prior to initiating the programming operation.

In another aspect, a method of reading one of a plurality of flash memory devices can include identifying the one of the plurality of flash memory devices, initiating an operation to read data from the one of the plurality of flash memory devices, asserting an interrupt indicator until the read operation is complete, and providing the data to a memory controller coupled to the plurality of flash memory devices. Generally, when the read operation is complete, the method further comprises deasserting the interrupt indicator.

In various embodiments, initiating the read operation comprises determining an initial address for the read operation and/or transferring the data from the one flash memory device to either the memory controller or a buffer coupled to the memory controller. When the method involves reading from the buffer, the interrupt indicator may enable indicating when the data in the buffer is ready, and the method may further comprise selecting a width for providing the data from the buffer to the memory controller.

The present invention advantageously provides an interface, arrangement, and method for controlling flash memory devices in multiple device systems without increasing a pin count. These and other advantages of the present invention will become readily apparent from the detailed description of embodiments below.

DETAILED DESCRIPTION

Figure 1:
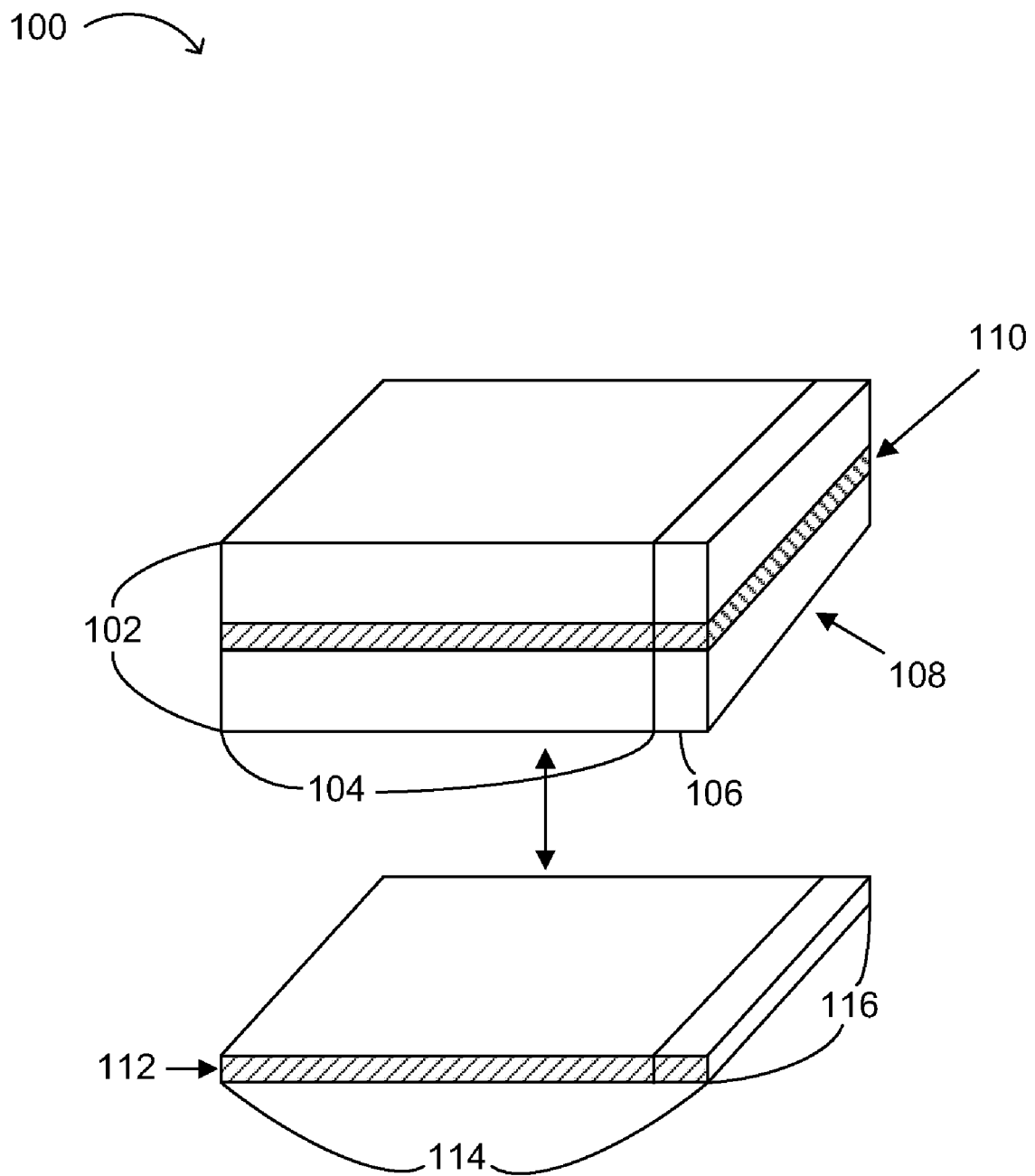
FIG. 1 is a block diagram showing a conventional memory array organization.

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "signal(s)" and "waveform(s)" may be used interchangeably, however, these terms are also given their art recognized meanings. The terms "node(s)", "input(s)", "output(s)", and "port(s)" may be used interchangeably, as may the terms "connected to", "coupled with", "coupled to", and "in communication with" (which terms also refer to direct and/or indirect relationships between the connected, coupled and/or communicating elements, unless the context of the term's use unambiguously indicates otherwise), and in general, use of one such form generally includes the others, unless the context of the term's use unambiguously indicates otherwise. However, these terms are also given their art recognized meanings.

The invention, in its various aspects, will be explained in greater detail below with regard to exemplary embodiments.

Figure 3:
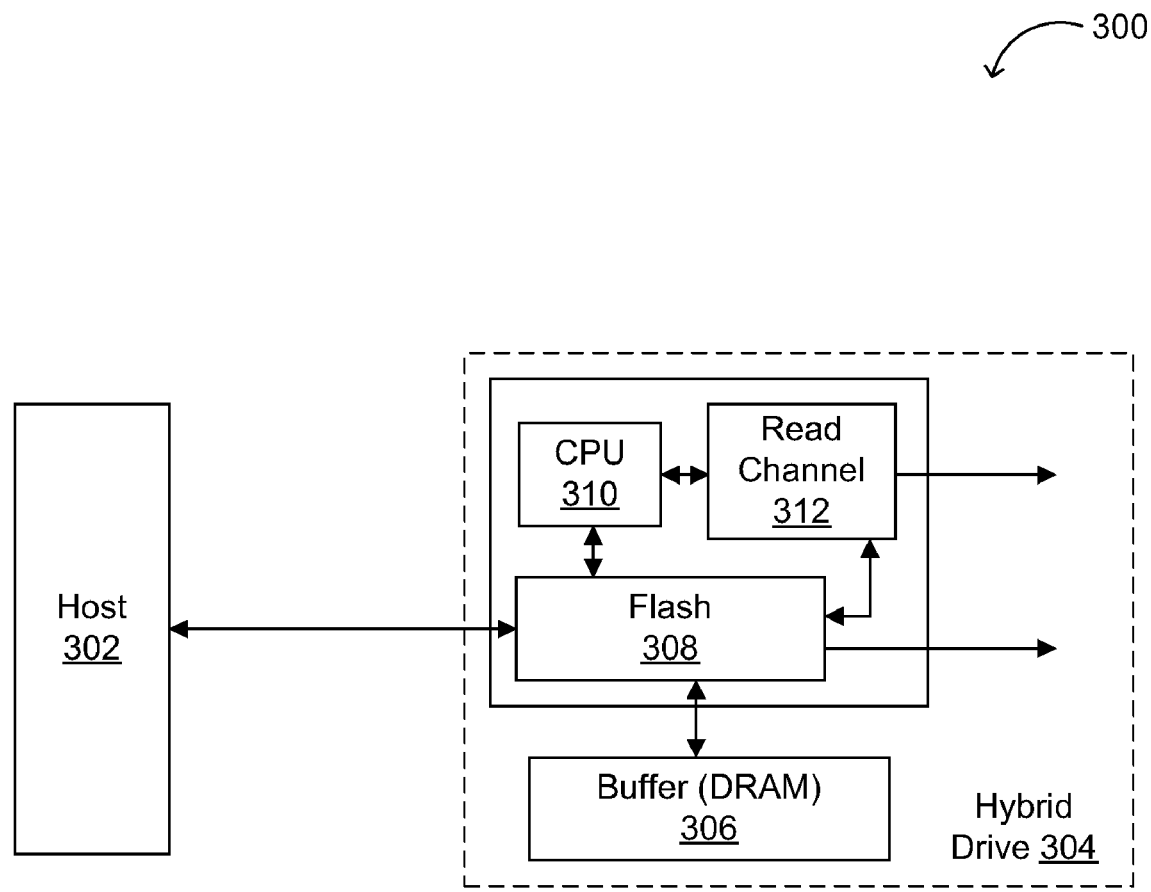
FIG. 3 is a block diagram showing an exemplary hybrid drive arrangement suitable for use in accordance with embodiments of the present invention.

FIG. 3 shows an exemplary hybrid drive arrangement 300 suitable for use in accordance with embodiments of the present invention. Host 302 can interface with flash device 308 in hybrid drive 304. In general, the flash device 308 comprises controller/flash memory module 404 (see FIG. 4 and the discussion thereof below). Referring back to FIG. 3, in various examples, the interface between host 302 and flash 308 can include a serial advanced technology attachment (SATA) interface or a parallel ATA (PATA) interface. Hybrid drive 304 can also include central processing unit (CPU) 310, read channel 312, and buffer memory (e.g., dynamic random access memory (DRAM)) 306. For example, CPU 310 may comprise a conventional microprocessor, (digital) signal processor (e.g., a DSP), or microcontroller. Read channel 312 may comprise conventional read channel data transfer processing blocks (e.g., one or more ports, signal detectors, encoders, decoders, interleavers, de-interleavers, error checking code [ECC] calculators and/or comparators, etc.). DRAM 306 can include from about 2 Mb to about 8 Mb of memory.

The present flash memory/controller module in particular embodiments can be utilized in hybrid drive 304, or in any suitable solid-state drive (SSD). Advantages of using flash memory in a hard drive, as opposed to a hard disk approach, include: (i) faster boot and resume times; (ii) longer battery life (e.g., for wireless applications); and (iii) higher data reliability.

Figure 2A:
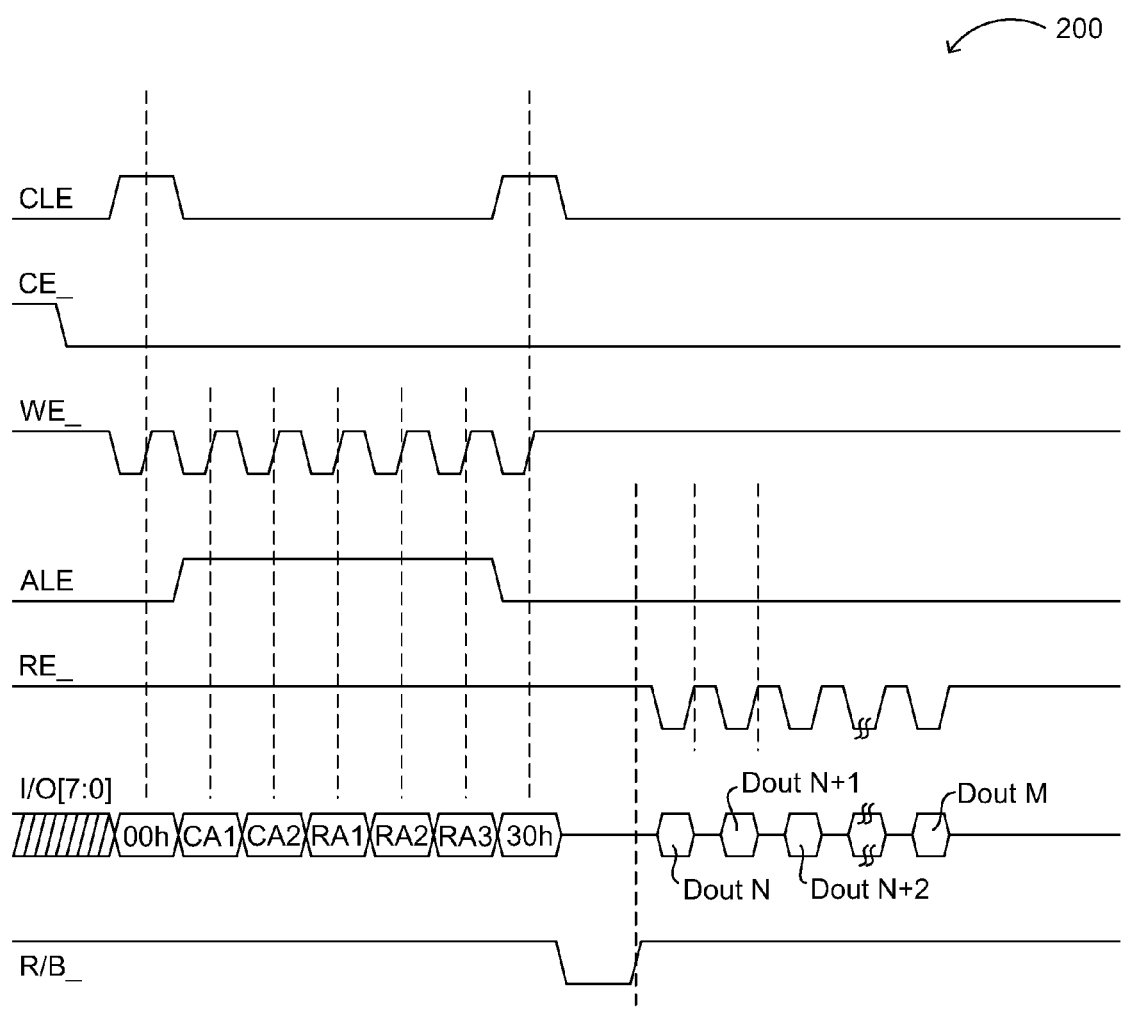
FIG. 2A is a timing diagram showing a conventional read operation.
Figure 2B:
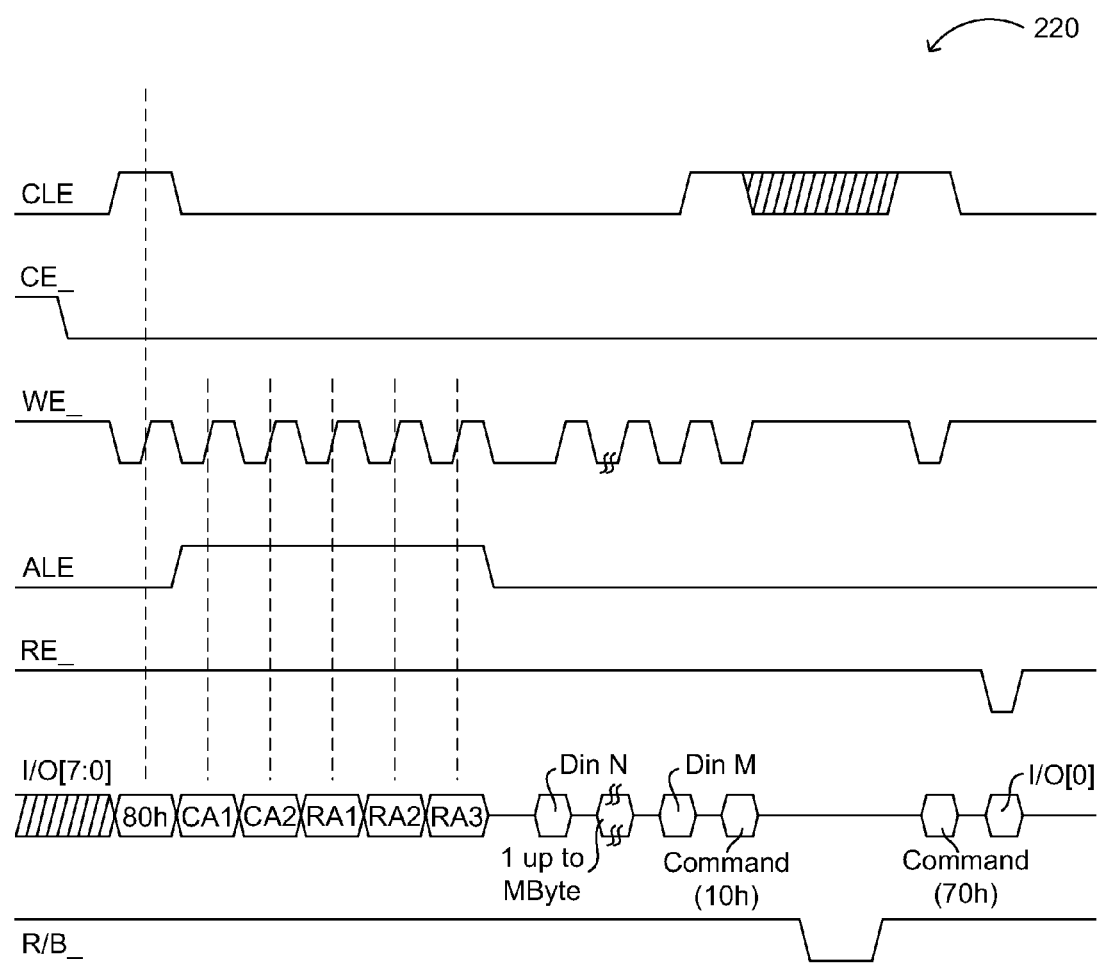
FIG. 2B is a timing diagram showing a conventional page program operation.
Figure 2C:
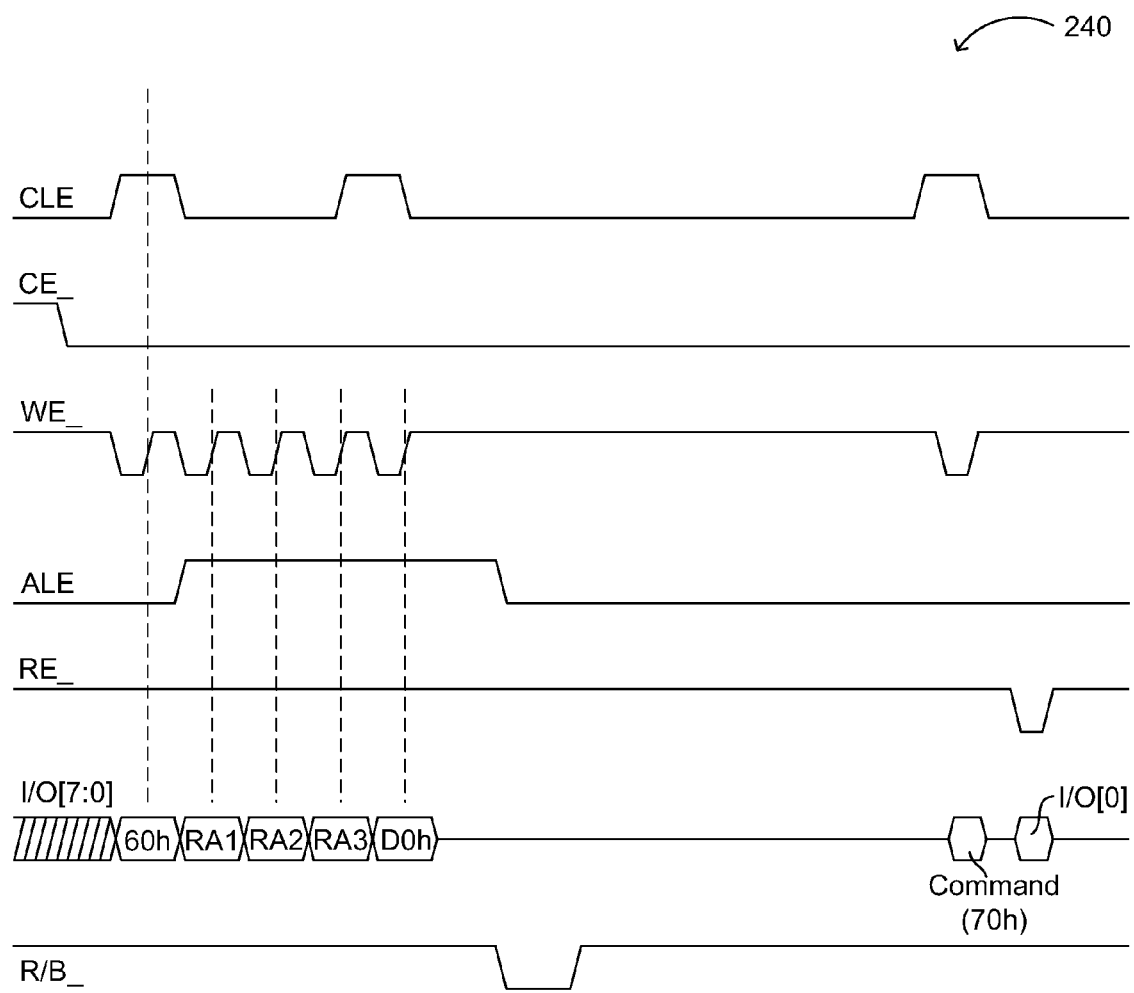
FIG. 2C is a timing diagram showing a conventional block erase operation.
Figure 4:
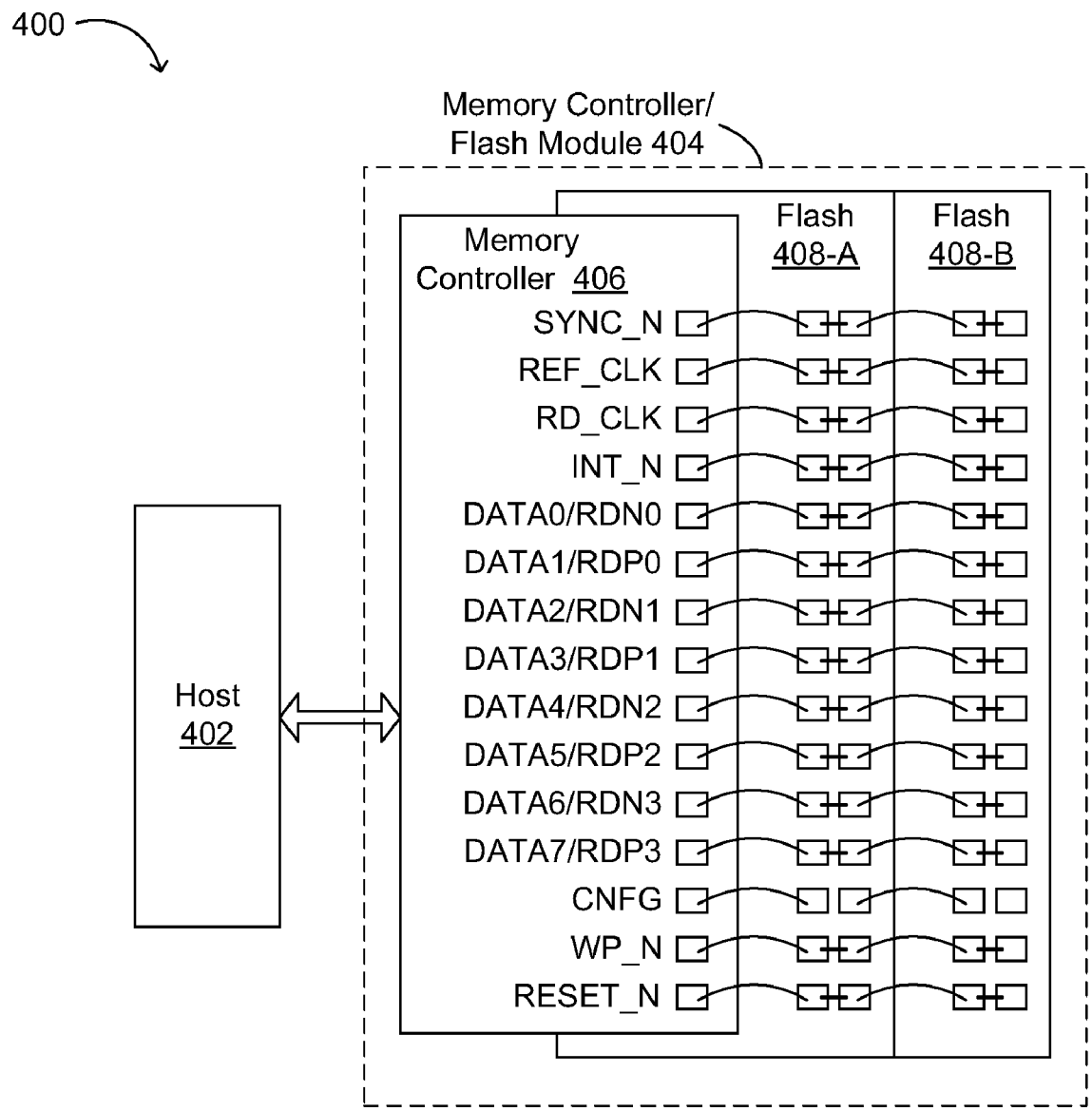
FIG. 4 is a block diagram showing an exemplary signal connection arrangement in accordance with embodiments of the present invention.

FIG. 4 shows an exemplary signal connection arrangement 400 in accordance with embodiments of the present invention. Host 402 can interface with memory controller/flash module 404. The interface between host 402 and memory controller 406 can be conventional (e.g., including pins and/or terminals for the signals shown in FIGS. 2A-2C and/or Table 1 above, or a subset thereof). Thus, in certain embodiments, the memory controller may include a command enable terminal (e.g., CLE) configured to transmit a command timing signal to the host, an address enable terminal (e.g., ALE) configured to transmit a clock signal to the host, a read enable terminal (e.g., RE_) configured to receive a read command from the host, and a write enable terminal (e.g., WE_) configured to transmit an instruction to the host.

Memory controller 406 can be connected with a plurality of flash memory devices (e.g., flash memory chip 408-A and flash memory chip 408-B) via each signal pin or terminal, as shown. In some embodiments, memory controller 406 may be implemented as an application specific integrated circuit (ASIC) or a system on a chip (SOC). In addition, configuration signal CNFG may connect through circuitry on flash devices 408-A and 408-B in serial fashion. Table 3 below shows a pin or terminal description for signals in the interface between controller 406 and flash memory devices 408-A and 408-B in accordance with embodiments of the present invention (e.g., see the column labeled "Memory Controller"), as related to a conventional NAND flash interface. Thus, as can be seen in the exemplary terminal descriptions in Table 3, the present memory controller may include an interface containing a configuration terminal (e.g., CNFG) configured to transmit one or more configuration commands to the flash memory devices, a command control terminal (e.g., SYNC_N) configured to transmit a command timing signal to the flash memory devices, a clock terminal (e.g., REF_CLK) configured to transmit a clock signal to said plurality of flash memory devices, and a read command terminal (e.g., RD_CLK) configured to receive a read command from the flash memory devices. "In/Out" refers to whether the signal is an input signal, an output signal, or both, on the controller 406.

TABLE 3

| NAND Flash | Memory Controller | In/Out | Description |
|---|---|---|---|
| Data in/out I/O[7:0] | DATA[7:0] | In/Out | Input/Output 8-bit data |
| Command latch enable CLE | SYNC_N | Out | Command timing signal |
| Address latch enable ALE Chip enable CE_ | REF_CLK | Out | Clock for flash IP block |
| Read enable RE_ | RD_CLK | In | Sampling clock for Read Data CH0-CH3; capture clock for data byte |
| Write enable WE_ | CNFG | Out | Chip configuration |
| Write protect WP_ | WP_N | Out | Write protect |

TABLE 3-continued

| NAND Flash | Memory Controller | In/Out | Description |
|---|---|---|---|
| Ready/busy output R/B_ | INT_N | In OD | Interrupt for PRG/ERASE commands; pull-up for memory controller |
| RESET_N | RESET_N | Out | |

In one embodiment, SYNC_N can represent a timing signal to start a command sequence. Once appropriately configured, three signals may be of particular utility for flash device control: synchronization, general timing, and read timing (e.g., SYNC_N, REF_CLK, and RD_CLK, respectively). On the DATA[7:0] pins, and referring now to FIGS. 5A-8D, "I" can represent a flash identification (ID), "C" can represent a command byte, "P" can represent a parameter, "D" can represent a data byte from the memory controller, and "F" can represent flash data bytes or analog read data from flash devices. Further, ID bytes generally precede command bytes to designate the flash memory device to which the particular command pertains. Also, broadcasting to each flash device (e.g., devices 408-A and 408-B in FIG. 4) coupled to the memory controller 406 can be accommodated via a designated ID byte. Example command bytes can be as shown below in Table 4, where each "x" is independently a hexadecimal value assigned to that particular command.

TABLE 4

| Command byte | Command |
|---|---|
| xxh | PROGRAM |
| xxh | WRITE BUFFER |
| xxh | EXECUTE PROGRAM |
| xxh | READ |
| xxh | READ BUFFER |
| xxh | READ STATUS |
| xxh | READ ID |
| xxh | DEVICE CONFIG |
| xxh | SET CONFIG |
| xxh | READ ERROR INFO |
| xxh | ERASE |
| xxh | RESET |

Parameter bytes may follow command bytes, and a total number of parameter bytes may be dependent on the particular command associated therewith. Data bytes may then follow parameter bytes, and/or the total number of data bytes may also be defined by the particular associated command. Further, data bytes may provide data for PROGRAM or WRITE BUFFER commands. Flash data bytes (i.e., those data bytes driven by a flash memory device) may be followed by either a command byte or a parameter byte, and the total number of flash data bytes may be defined by a particular command associated therewith. For example, flash data bytes may include data for READ BUFFER, READ DATA, READ STATUS, READ ID, and/or SEND READ DATA commands.

A RESET command can instruct the controller/flash memory module 404 to abort a command and/or reset an associated (or identified) flash memory device. An example command description for a command or instruction to configure a flash ID (e.g., a DEVICE CONFIG command) is shown below in Table 5.

TABLE 5

| Symbol | B7 | B6 | B5 | B4 | B3 | B2 | B1 | B0 |
|---|---|---|---|---|---|---|---|---|
| I | | | | | xxh (broadcast) only | | | |
| C | | | | | xxh (DEVICE CONFIG) | | | |
| P(P1-Pn) | | | | | Authentication bytes | | | |

A READ ID command can verify an authentication byte, a product code, and a flash memory device or chip revision, for example. An exemplary description for a verification command or instruction (e.g., READ ID) is shown below in Table 6.

TABLE 6

| symbol | B7 | B6 | B5 | B4 | B3 | B2 | B1 | B0 |
|---|---|---|---|---|---|---|---|---|
| I | | | | | Flash ID | | | |
| C | | | | | xxh (READ ID) | | | |
| F1 | | | | | Product code | | | |
| F2 | | | | | Flash chip revision | | | |
| F3 | | | | | Authentication byte | | | |

A SET CONFIG command can enable and/or disable interrupts, and configure a number of bits per cell, for example. An exemplary description for an interrupt enable or cell configuration command or instruction (e.g., SET CONFIG) is shown below in Table 7.

TABLE 7

| symbol | B7 | B6 | B5 | B4 | B3 | B2 | B1 | B0 |
|---|---|---|---|---|---|---|---|---|
| I | | | | Flash ID or xxh (broadcast) | | | | |
| C | | | | xxh (SET CONFIG) | | | | |
| P1 | D16 | | MLC | | EN_P | IEN_E | IEN_P | IEN_R |
| | D16: '1' = 16-bit data bus; '0' = 8-bit data bus; | | | | | | | |
| | MLC: set a number of bits per cell; | | | | | | | |
| | EN_P: '1' = enable packing of programming data; | | | | | | | |
| | IEN_E: '1' = enable interrupt when ERASE operation completed; | | | | | | | |
| | IEN_P: '1' = enable interrupt when PROGRAM completed; | | | | | | | |
| | IEN_R: '1' = enable interrupt when READ data is ready | | | | | | | |

Figure 5A:
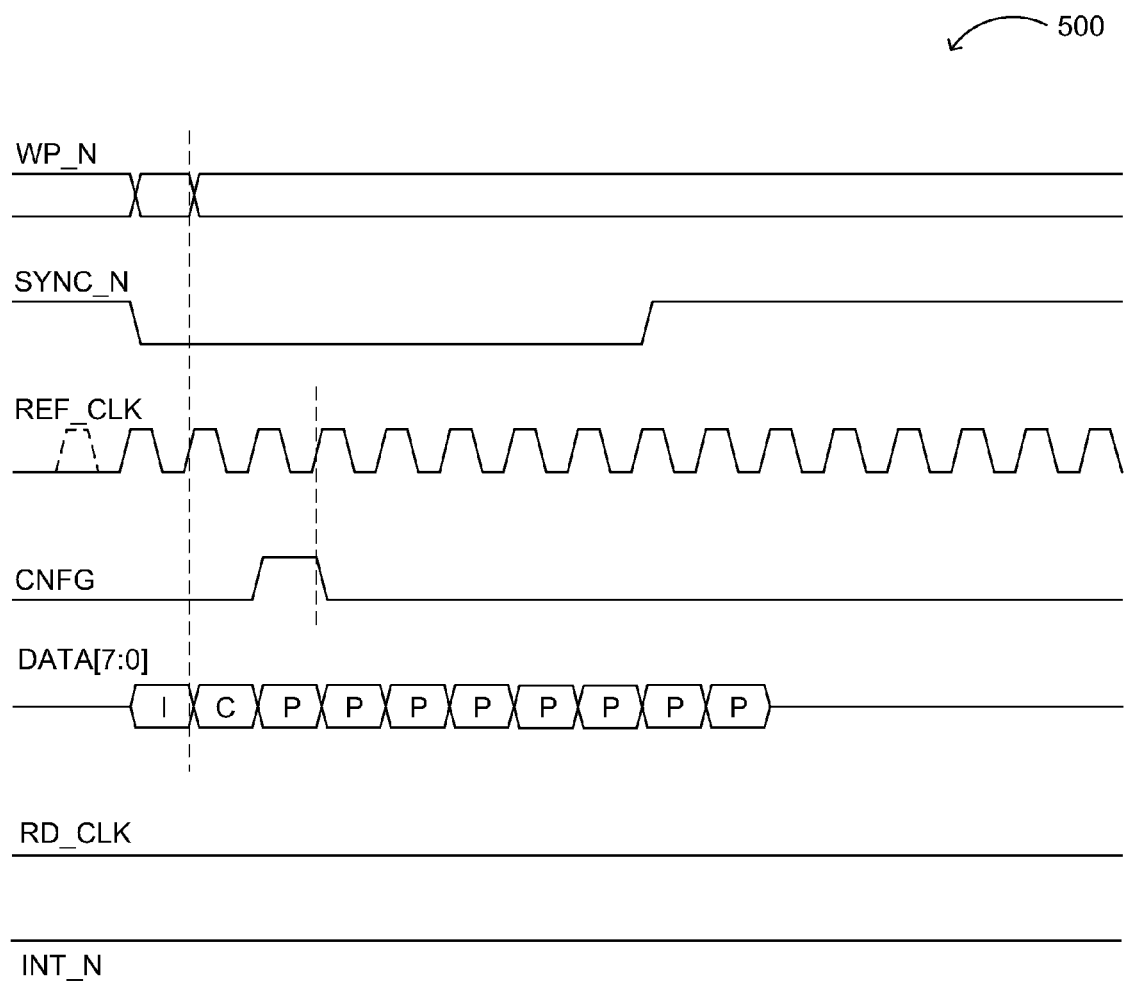
FIG. 5A is a timing diagram showing an exemplary device configuration in accordance with embodiments of the present invention.

FIG. 5A shows a timing diagram 500 for an exemplary device configuration operation in accordance with embodiments of the present invention. Upon a transition of the write protect and/or synchronization signal(s) to an asserted state, the flash device identification byte (e.g., a flash ID or "I" byte) and the command byte (e.g., a "C" byte) are transmitted from the controller to the flash memory devices. In the embodiment shown in FIG. 4, device identification information is transmitted over the data terminals (e.g., DATA[0:7]), but in an alternative embodiment, device identification information could be transmitted over dedicated device ID terminals if enough terminals are available. Thus, the present memory controller may further include device enable terminals configured to identify one of the flash memory devices. Referring back to FIG. 5A, authentication data "P" can be provided once CNFG transitions (e.g., goes to a "high" binary logic state) for a cycle after the flash ID byte and the command byte have been supplied, as shown. Also, synchronization (or command timing) signal SYNC_N can transition (e.g., go to a "high" binary logic state) one cycle prior to the last authentication data portion. In some embodiments, such authentication data portions can be provided for up to 16 REF_CLK cycles. Further, a device configuration command may be ignored by a particular flash memory device if: (i) the particular device has already been configured; (ii) the write protect signal is not asserted (e.g., WP_N='0'); (iii) the configuration signal (e.g., CNFG) has not been asserted; and/or (iv) the configuration signal has been asserted for two or more clock periods, or two separate times.

Figure 5B:
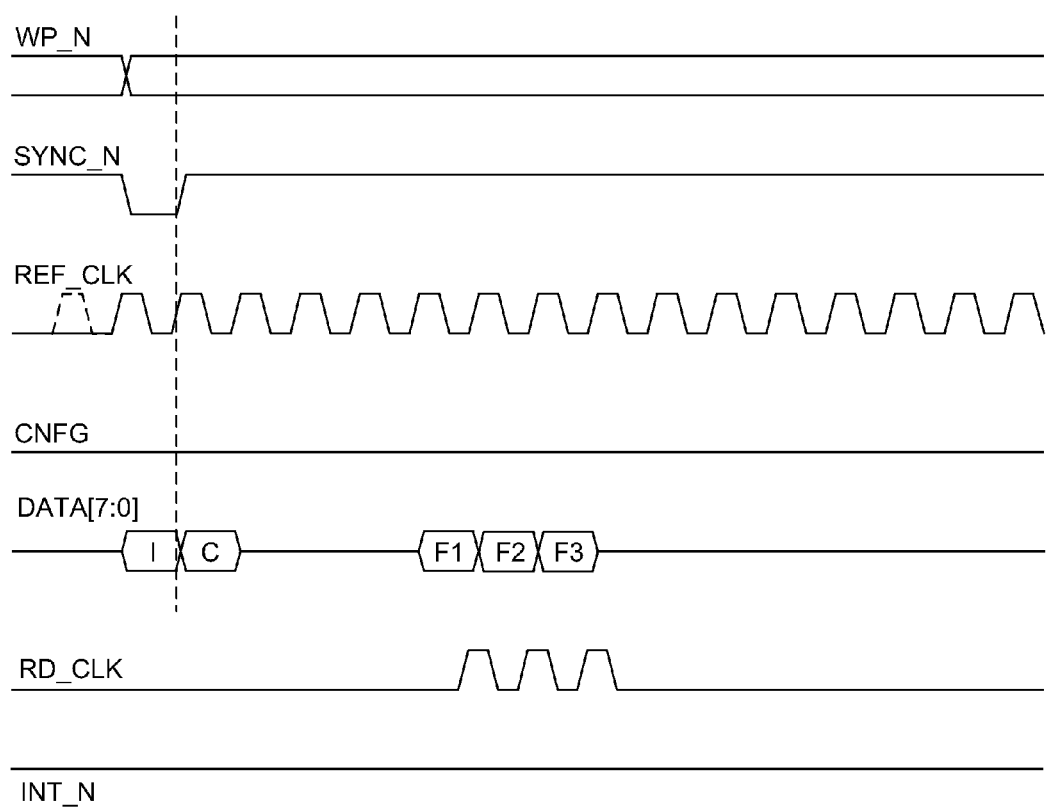
FIG. 5B is a timing diagram showing an exemplary read identification operation in accordance with embodiments of the present invention.

FIG. 5B shows a timing diagram 550 for an exemplary operation to read the identification information of one of the plurality of flash memory devices in accordance with embodiments of the present invention. To execute the read ID operation, the write protect signal (e.g., WP_N) may be asserted for the entire operation, but the synchronization signal (e.g., SYNC_N) may be asserted for a limited number of cycles of the timing signal (e.g., a single cycle of REF_CLK). The read identification command (e.g., 90h) can be supplied, followed a few cycles later by flash data bytes F1, F2, and F3. To synchronize these data bytes, the read timing signal (e.g., RD_CLK) can be supplied from the particular flash device indicated by flash identification byte "I" supplied prior to the command byte "C". Thus, in the embodiment shown in FIG. 4, device identification information is received over the data terminals (e.g., DATA[0:7]), but alternatively, it could be received over dedicated device ID terminals.

Figure 6:
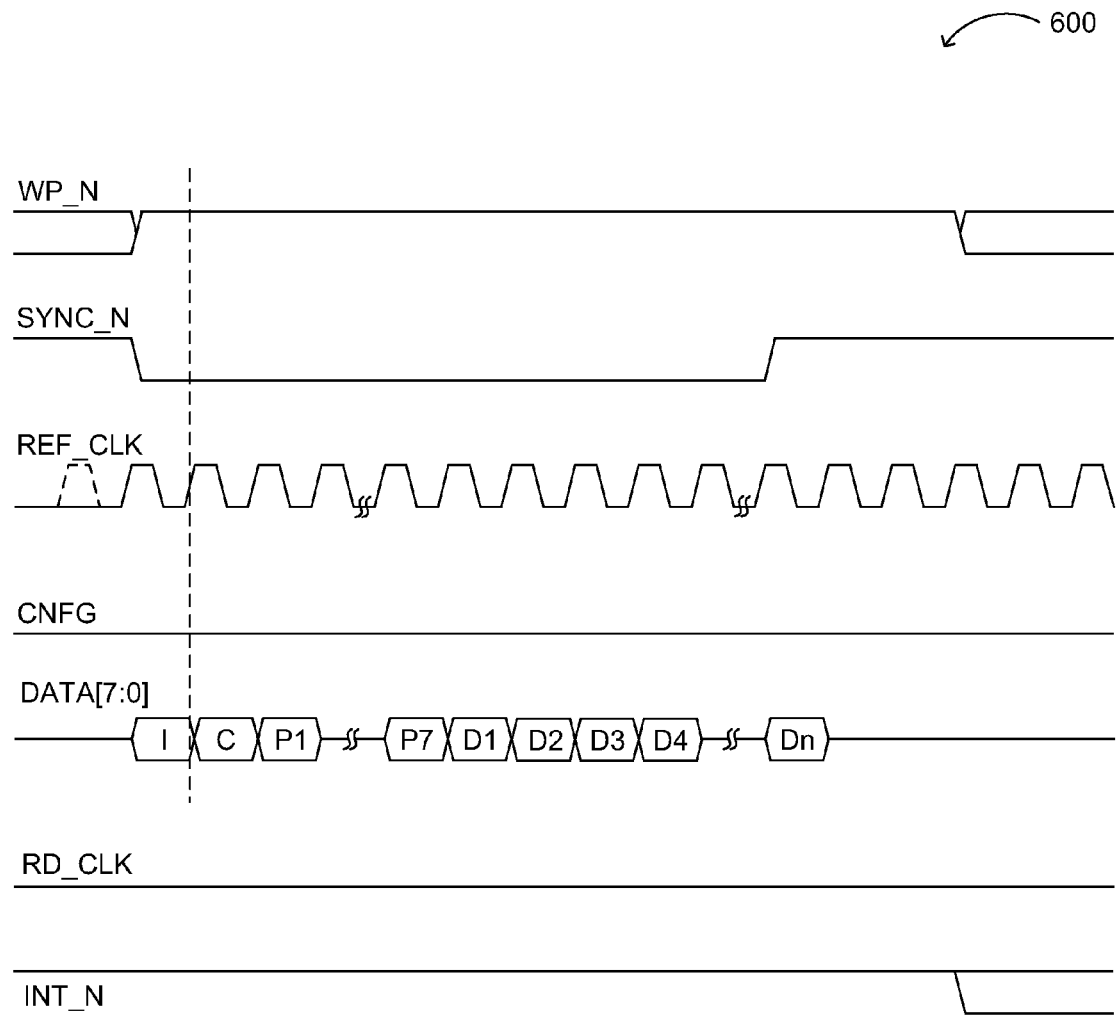
FIG. 6 is a timing diagram showing an exemplary program execute operation in accordance with embodiments of the present invention.

FIG. 6 shows a timing diagram 600 for an exemplary operation to program one of a plurality of flash memory devices in accordance with embodiments of the present invention. To execute the program operation, the write protect signal (e.g., WP_N) may be asserted for the entire operation (or longer), but as soon as the synchronization signal (e.g., SYNC_N) is deasserted, the program operation terminates. Parametric data P1-P7 can be supplied from the memory controller to the flash memory device identified in the identification byte (e.g., indicated by "I") following the command byte (e.g., 10h). Data for programming, such as D1-Dn on DATA[7:0] or DATA[15:0], can be supplied by the memory controller. Also, an interrupt signal (e.g., INT_N) can be also driven to a predetermined state (e.g., a binary logic "low" state) by the flash memory device if a packing enable signal is asserted (e.g., IEN_P='1') to indicate completion of the programming operation.

Figure 7:
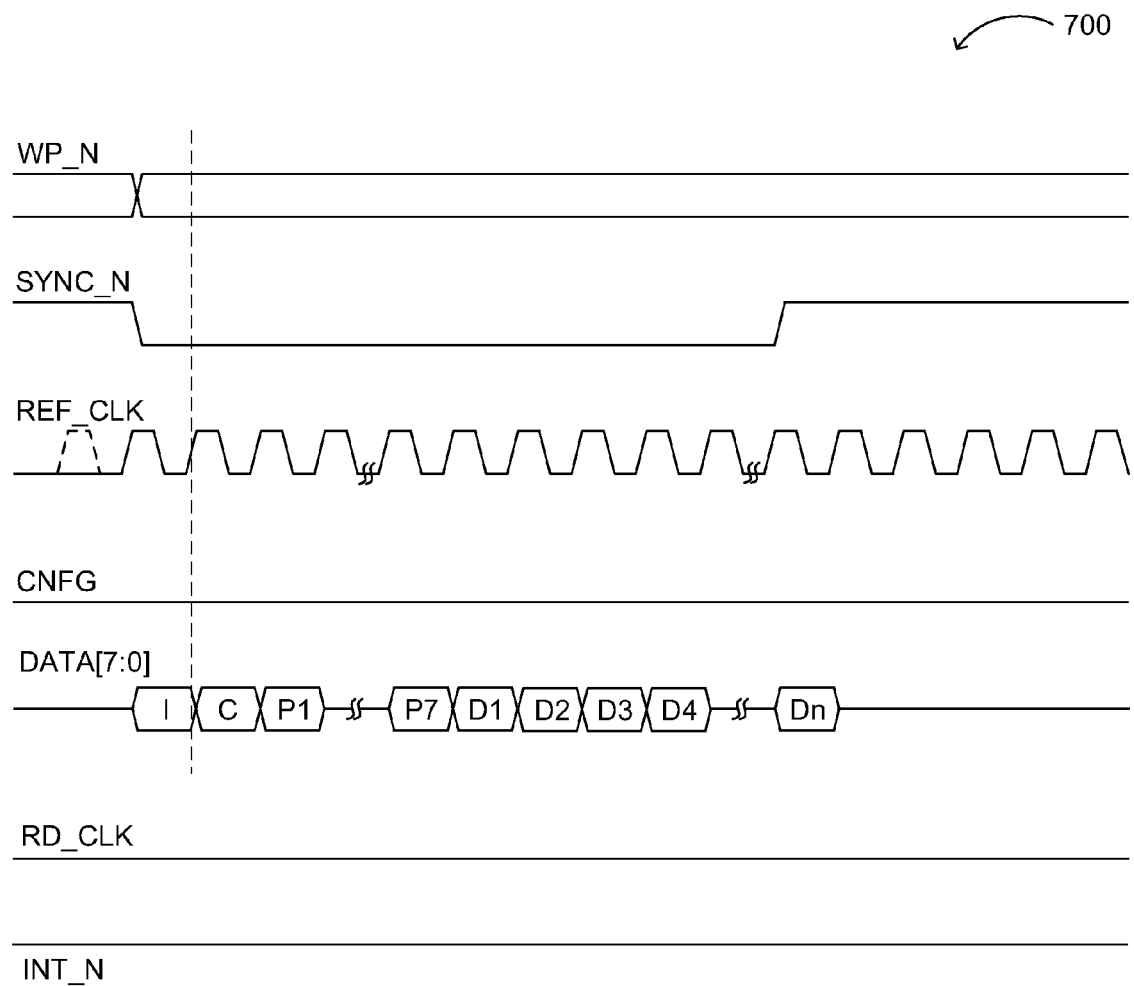
FIG. 7 is a timing diagram showing an exemplary write programming data to buffer operation in accordance with embodiments of the present invention.

FIG. 7 shows a timing diagram 700 for an exemplary operation to write programming data to a buffer (e.g., buffer 306 in FIG. 3) in accordance with embodiments of the present invention. To execute this "write to buffer" operation, similar to the programming operation, the write protect signal (e.g., WP_N) may be asserted for the entire operation (or longer), but as soon as the synchronization signal (e.g., SYNC_N) is deasserted, the "write to buffer" operation terminates. Parametric data P1-P7 can be supplied from the memory controller to the flash memory device identified in the identification byte (indicated by "I") following the command byte (e.g., 12h). Data to be written to the buffer, such as D1-Dn on DATA[7:0] or DATA[15:0], can be supplied by the memory controller. However, if the write protect and/or interrupt signal do not transition within a predetermined number of cycles of the reference clock (e.g., 3 cycles of REF_CLK) from the transition of the synchronization signal, then the memory controller writes the data to the buffer, rather than programs it into the identified flash memory device.

Figure 8A:
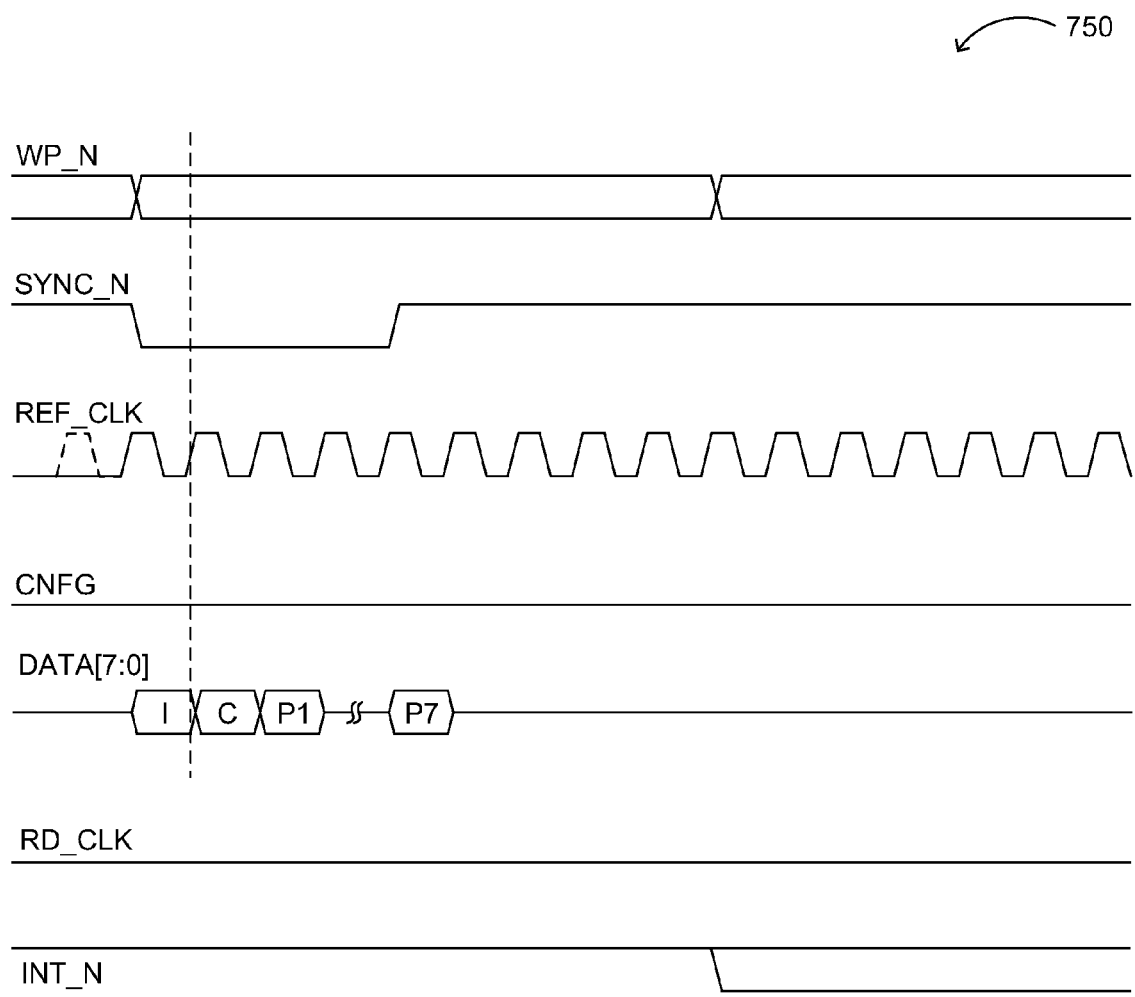
FIG. 8A is a timing diagram showing a first exemplary execute program operation in accordance with embodiments of the present invention.

FIG. 8A shows a timing diagram 750 for a first exemplary execute program operation in accordance with embodiments of the present invention. The write protect signal (e.g., WP_N) may be asserted for the entire operation (or for a certain minimum number of cycles of the timing signal REF_CLK), but as soon as the synchronization signal (e.g., SYNC_N) is deasserted, the execute program operation terminates. Parametric data P1-P7 can be supplied from the memory controller to the flash memory device identified in the identification byte (indicated by "I") following the command byte (e.g., 13h). The interrupt signal (e.g., INT_N) can be also driven to a predetermined state (e.g., a binary logic "low" state) by the flash memory device if an interrupt enable signal is asserted (e.g., EN_P='1') to indicate completion of the execute program operation.

Figure 8B:
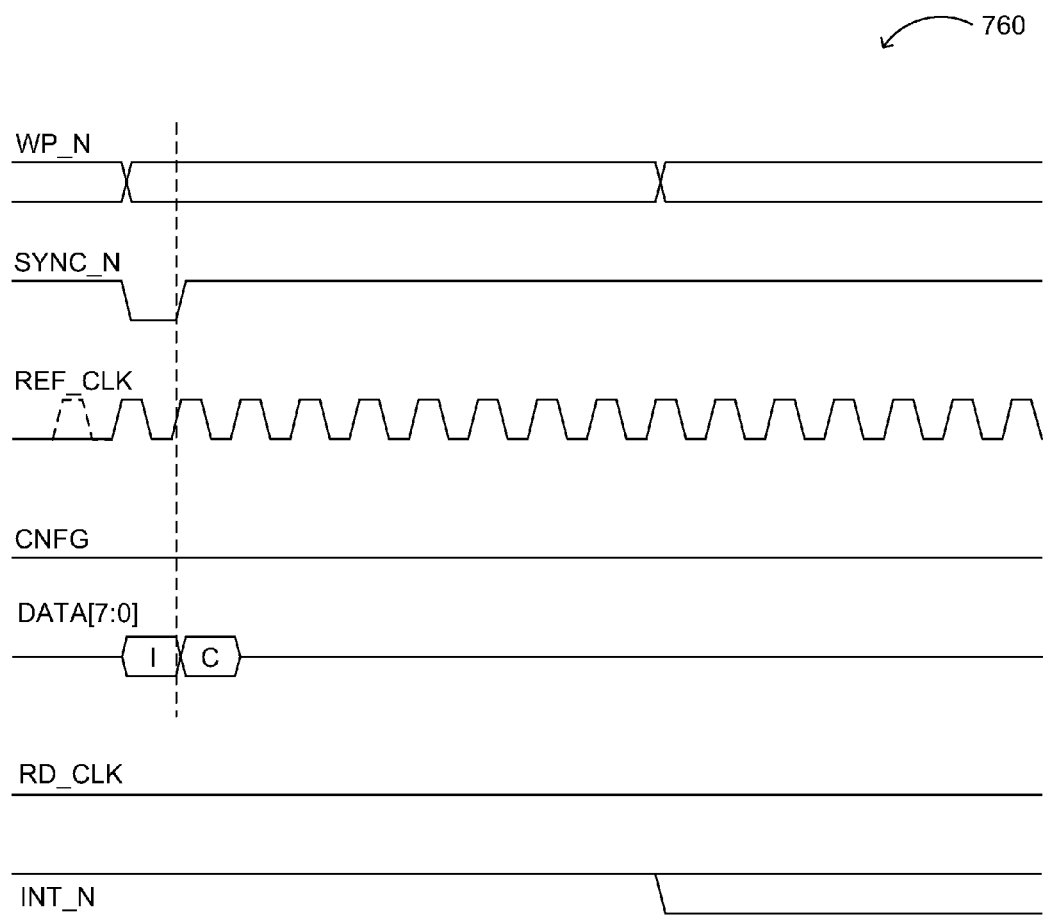
FIG. 8B is a timing diagram showing a second exemplary execute program operation in accordance with embodiments of the present invention.

FIG. 8B shows a timing diagram 760 for a second exemplary execute program operation in accordance with embodiments of the present invention. This embodiment is similar to that of FIG. 8A, except that the synchronization signal is deasserted after a single cycle of the timing signal (e.g., REF_CLK), in which case parametric information may not be supplied to the identified flash memory device.

Figure 8C:
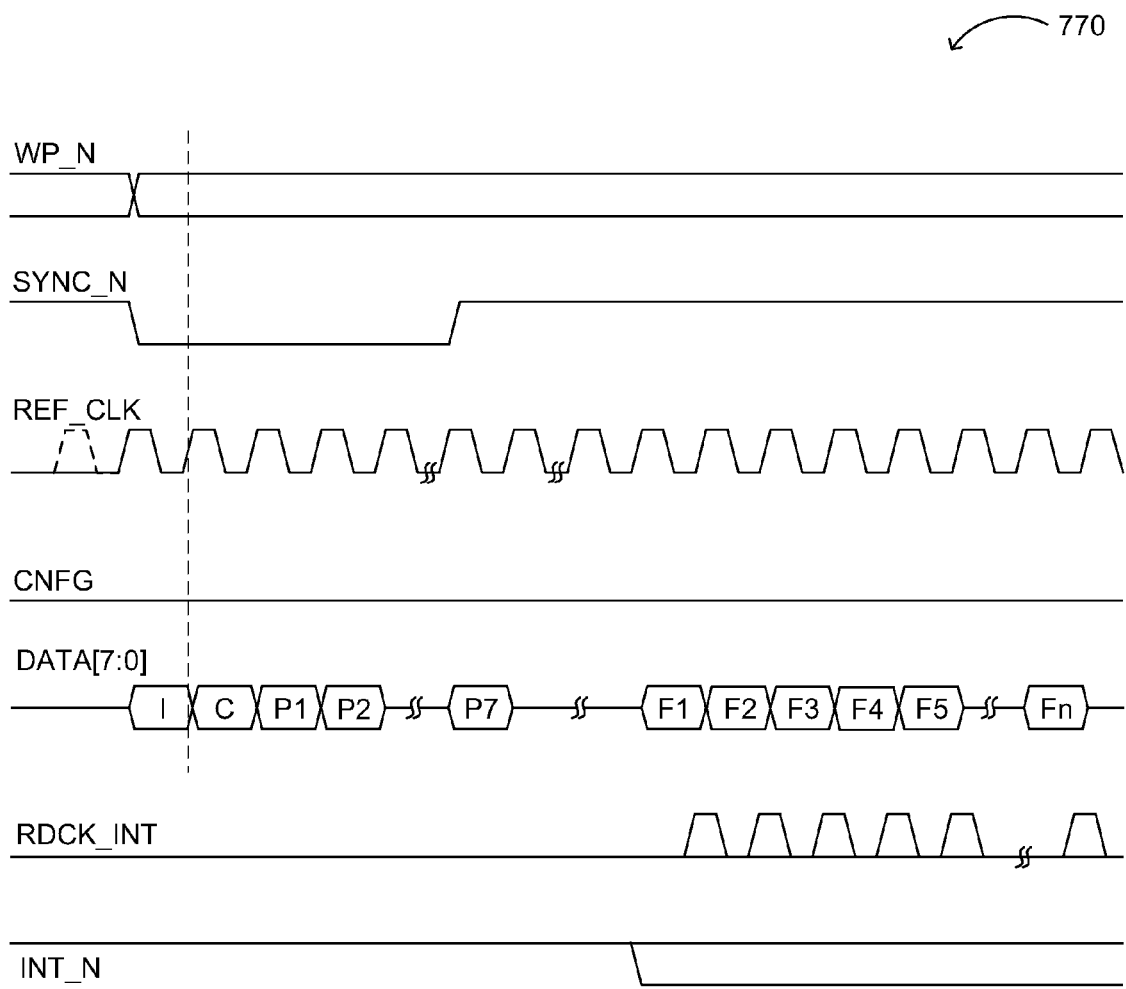
FIG. 8C is a timing diagram showing an exemplary read cell data and buffer data to host operation in accordance with embodiments of the present invention.

FIG. 8C shows a timing diagram 770 for an exemplary operation to read cell data and/or buffer data (e.g., transfer such data to the host) in accordance with embodiments of the present invention. In this operation (e.g., command 30h), cell data can be read, and buffer data can be sent to the host. In general, the write protect, synchronization and/or interrupt signals are asserted and deasserted similarly to FIGS. 6 and 8A. Data that is read from the flash memory device (F1-Fn) may be provided on analog outputs RDP0/RDN0-RDP3/RDN3 (e.g., an 8-bit digital bus or a 4-bit differential bus), or RDP0/RDN0-RDP7/RDN7 (e.g., a 16-bit digital bus or an 8-bit differential bus). With this data from the flash memory, a read timing signal (e.g., RDCK_INT) can be provided from the flash memory device to the controller to provide synchronization. However, the interrupt signal (e.g., INT_N) can be discharged by the flash memory device when the interrupt enable signal is asserted (IEN_R='1') to indicate that read data is ready.

Figure 8D:
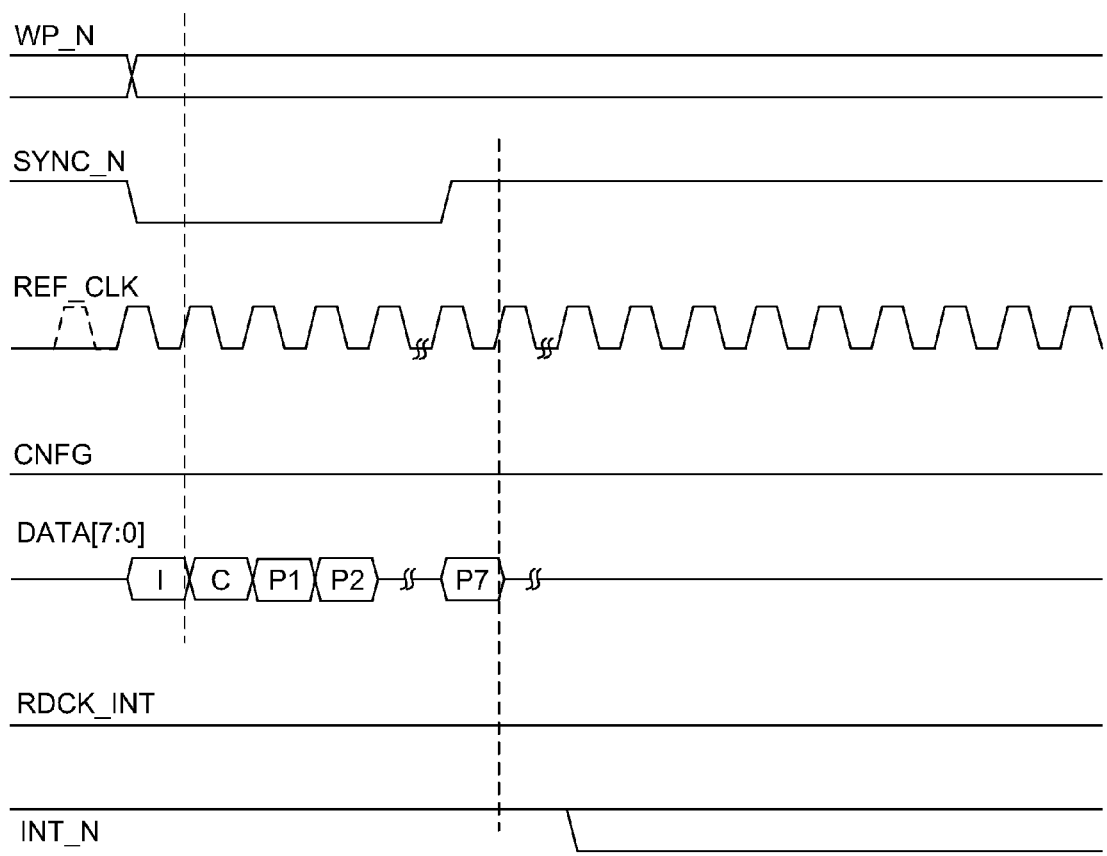
FIG. 8D is a timing diagram showing an exemplary set read information operation in accordance with embodiments of the present invention.

FIG. 8D shows a timing diagram 790 for an exemplary operation to set read parameter information in accordance with embodiments of the present invention. In this operation (e.g., command 31h), the write protect, synchronization and/or interrupt signals are asserted and deasserted similarly to FIGS. 6 and 8C. Parameter bytes P1-P7 are provided to the identified flash device following the identification ("I") and command ("C") bytes. Also, like FIG. 8C, the interrupt signal (e.g., INT_N) can be discharged by the flash memory device when the interrupt enable signal is asserted (IEN_R='1') to indicate that read data is ready.

Figure 9A:
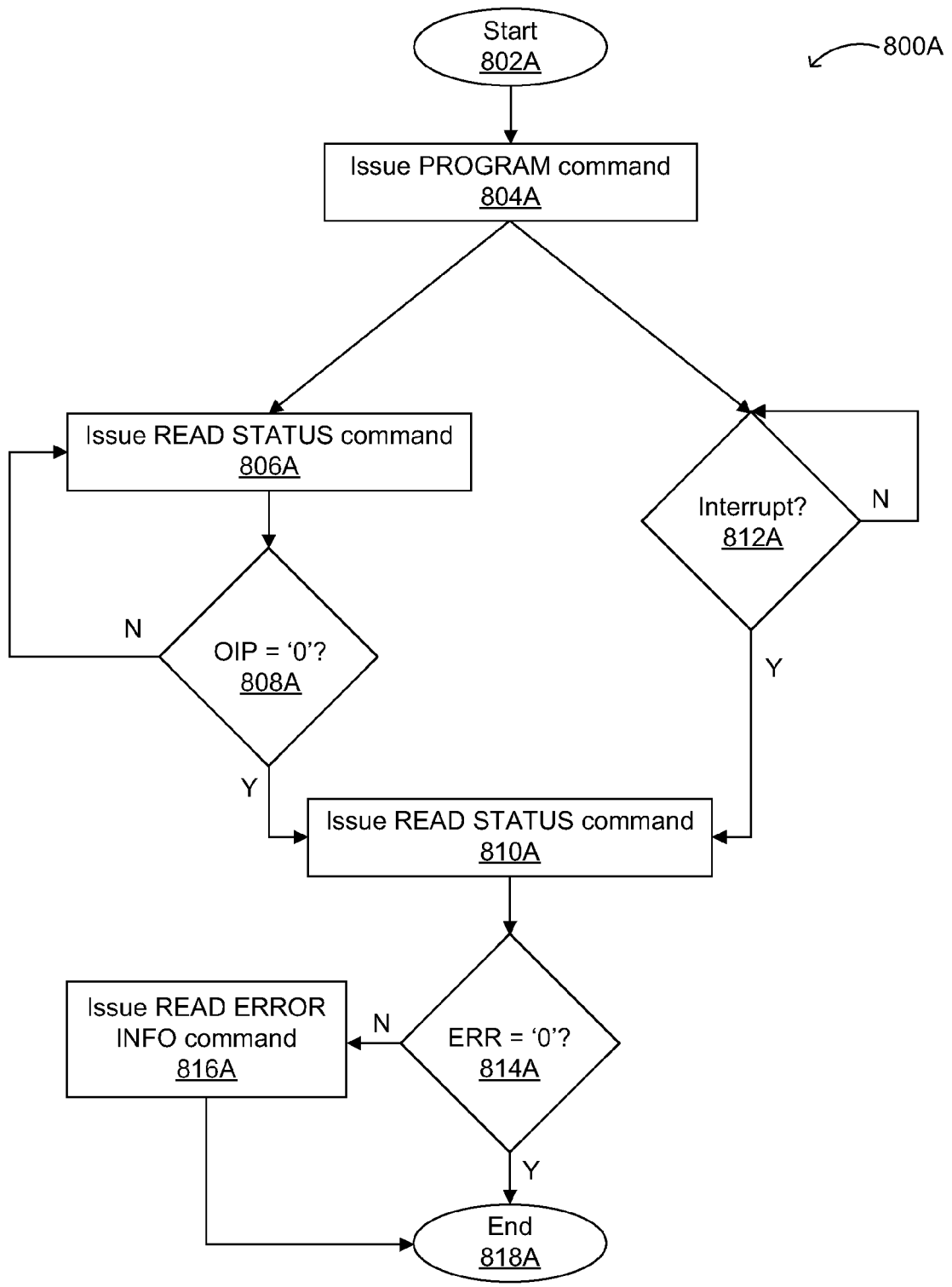
FIG. 9A is a flow diagram showing a first exemplary method of programming in accordance with embodiments of the present invention.

FIG. 9A shows a flow diagram 800A for a first exemplary method of programming in accordance with embodiments of the present invention. The flow can begin (802A), and a program command may be issued by or from the controller (804A). For example, the program command may clear a buffer flag, set a cell address, obtain programming data, and/or execute a data programming operation. A read status command may then be issued by or from the controller (806A), and may continue until an "operation in progress" (OIP) indicator is de-asserted (e.g., OIP='0,' 808A). The read status command generally determines the status of a (previous) command, such as an erase command, a program command, or a read command. The status of such commands may include no error, command execution in progress, and/or one or more errors or error types, depending on the number of bits available for providing read status information. When the OIP indicator is de-asserted (808A) and/or an interrupt occurs (812A), a second read status command may be issued (810A). When the operation is complete and no error occurs, a "no error" status may be indicated. Alternatively, the second read status command (810A) may either clear or assert an interrupt, depending on whether an error occurred during the operation (e.g., command execution). If an error is found (e.g., by asserting an error indicator or flag, step 814A), a read error information command may be issued (816A) to get error information, and the flow can complete (818A). If no error is found (ERR='0' in 814A), the flow can complete (818A).

Figure 9B:
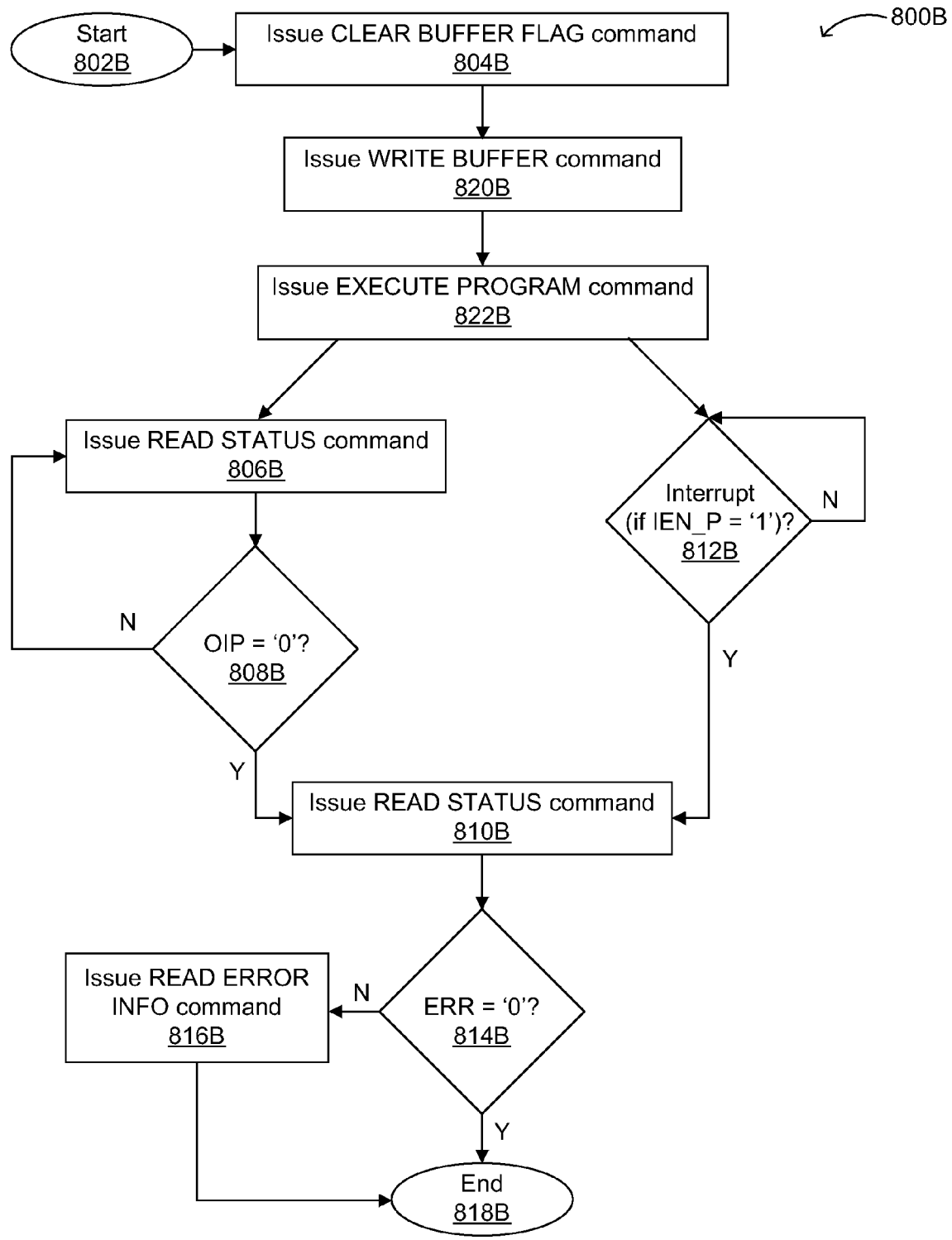
FIG. 9B is a flow diagram showing a second exemplary method of programming in accordance with embodiments of the present invention.

FIG. 9B shows a flow diagram 800B for a second exemplary method of programming in accordance with embodiments of the present invention. The flow can begin (802B), and a clear buffer flag command may be issued by or from the controller (804B). The clear buffer flag command generally clears the flag or indicator indicating the status of the internal data buffer (e.g., buffer 306 in FIG. 3). Next, referring back to FIG. 9B, a write buffer command may be issued (820B). For example, the write buffer command may set or determine a cell address (e.g., an initial flash memory address) for the programming operation and/or obtain programming data (e.g., from the controller 406 or host 402 in FIG. 4). Next, referring back to FIG. 9B, an execute program command may be issued (822B). The execute program command generally initiates execution of the programming operation. The remainder of the flow 800B is similar to the exemplary flow 800A of FIG. 9A. For example, a read status command may then be issued (806B) and may continue until the OIP indicator is de-asserted (808B). When the OIP indicator is de-asserted (808B) and/or an interrupt occurs (812B), a second read status command may be issued (810B), which may clear the interrupt, end the flow (OIP is deasserted and no error is indicated [814B]), or indicate an error. If an error is found (814B), a read error info command may be issued (816B) to obtain error information, and the flow can complete (818B).

Figure 9C:
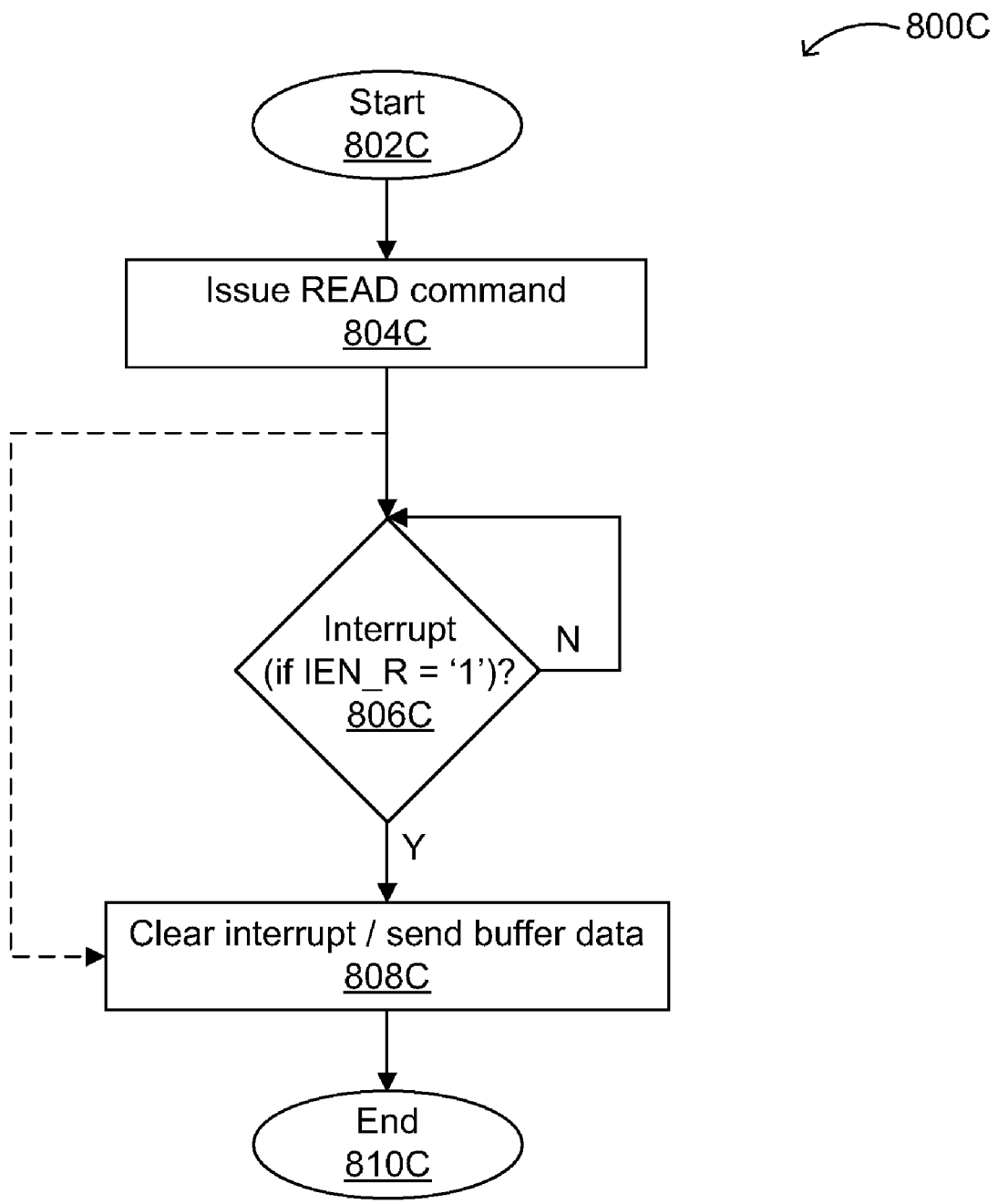
FIG. 9C is a flow diagram showing a first exemplary method of reading in accordance with embodiments of the present invention.

FIG. 9C shows a flow diagram 800C for a first exemplary method of reading in accordance with embodiments of the present invention. The flow can begin (802C), and a read command may be issued by or from the controller (804C). For example, the read command can set or determine a cell address (e.g., an initial flash memory address) for the read operation and/or execute the read operation (e.g., a transfer of data from one flash memory device identified from a plurality of flash memory devices 408-A and 408-B [FIG. 4] to a buffer 306 [FIG. 3]). As long as an interrupt enable signal (e.g., IEN_R) is asserted, the interrupt indicator or flag is also asserted, and the read operation continues (generally, no new command can be executed during an asserted interrupt indicator). However, when the interrupt is over and the corresponding indicator has a predetermined state complementary to the asserted state (e.g., a binary logic '1'; 806C), a clear interrupt command and/or a send buffer data command may be issued (808C), and the flow can complete (810C). For example, the send buffer data command may include reading one or more cell addresses of the flash memory device, reading a cell count (e.g., a number of consecutive or contiguous addresses or cells from which data is read) from the flash memory device, and/or transferring data from the identified flash memory device or the buffer to the host. Alternatively, the clear interrupt and/or send buffer data command(s) (808C) can occur directly after issuing the read command (804C).

Figure 9D:
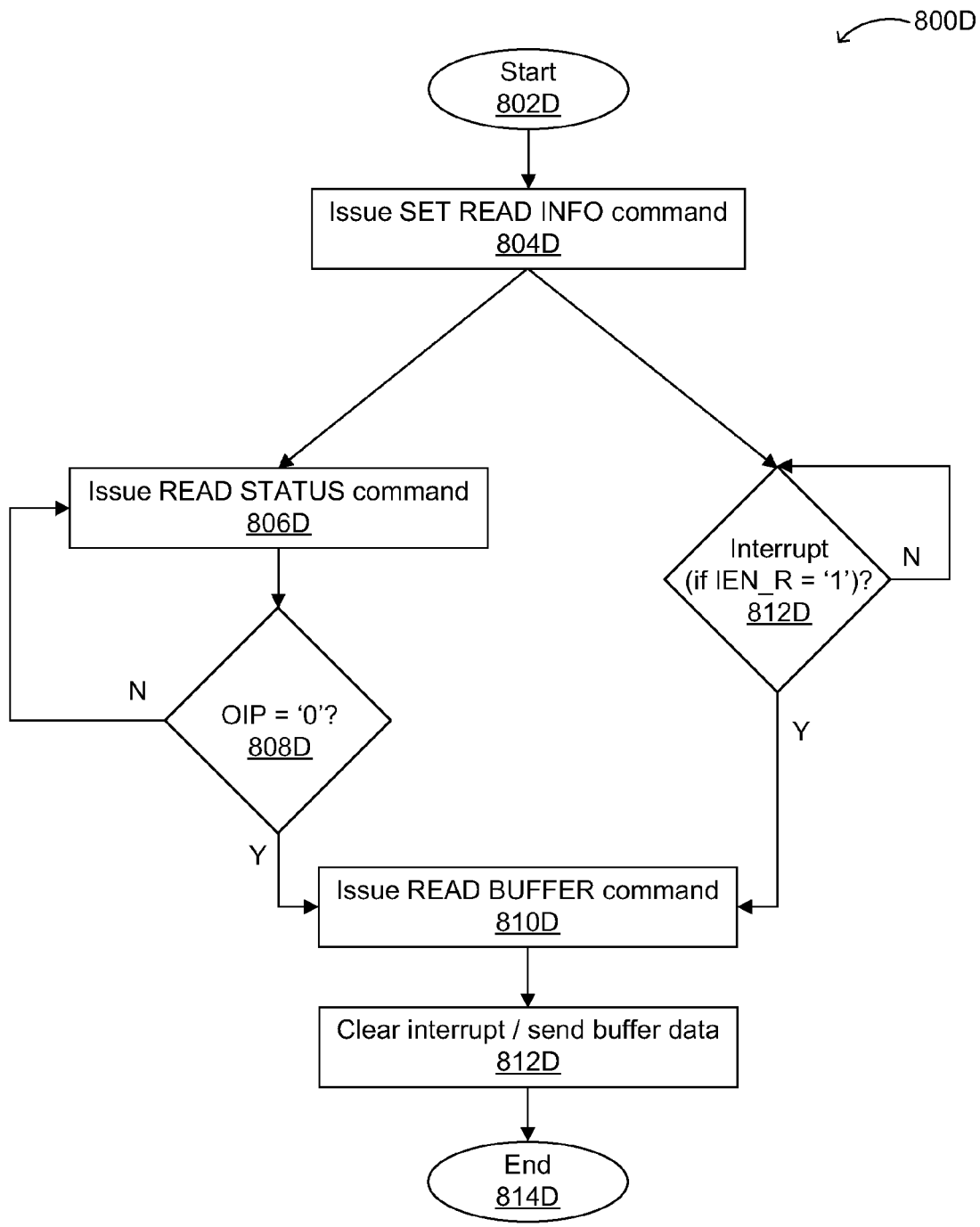
FIG. 9D is a flow diagram showing a second exemplary method of reading in accordance with embodiments of the present invention.

FIG. 9D shows a flow diagram 800D for a second exemplary method of reading in accordance with embodiments of the present invention. The flow can begin (802D), and a set read information command may be issued by or from the controller (804D). For example, the set read information command can set or determine a cell address (e.g., an initial flash memory address) for the read operation, execute the read operation, and/or assert an interrupt indicator or flag. As in FIG. 9C, a read status command may be issued (806D), and may continue until an OIP indicator is asserted (808D). Referring now back to FIG. 9D, when the OIP indicator is asserted (808D) and/or an interrupt indicator is de-asserted (812D), a read buffer command may be issued (810D). For example, the read buffer command may include reading one or more cell addresses of the flash memory device, reading a cell count (e.g., a number of consecutive or contiguous addresses or cells from which data is read) from the flash memory device, and/or reading or transferring data from the buffer to the host. Next, similarly to the flow 800C of FIG. 9C, a clear interrupt command and/or send buffer data command may be issued from the controller (812D), and the flow can complete (814D).

Exemplary Systems Using the Present Circuit

In a further aspect of the invention, a system may comprise the present apparatus or circuit for controlling flash memory devices. Various exemplary implementations of the present invention are shown in FIGS. 10A-10G.

Figure 10A:
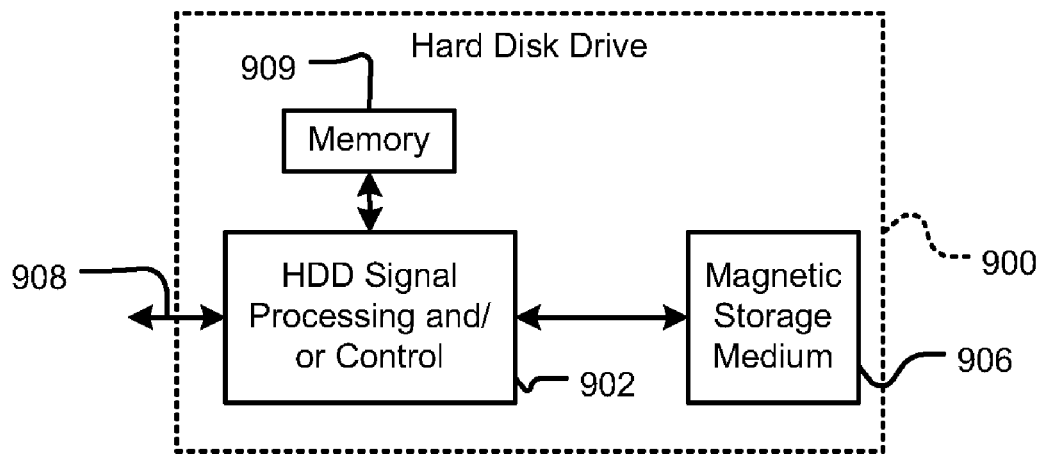
FIGS. 10A-10G are diagrams showing exemplary systems in which the present invention may be used.

Referring now to FIG. 10A, the present invention can be implemented in a hard disk drive (HDD) 900. The present invention may implement either or both signal processing and/or control circuits, which are generally identified in FIG. 10A at 902. In some implementations, the signal processing and/or control circuit 902 and/or other circuits (not shown) in the HDD 900 may process data, perform coding and/or encryption, perform calculations, and/or format data that is output to and/or received from a magnetic storage medium 906.

The HDD 900 may communicate with a host device (e.g., 302 in FIG. 3 or 402 in FIG. 4) such as a computer, mobile computing devices such as personal digital assistants, cellular phones, media or MP3 players and the like, and/or other devices via one or more wired or wireless communication links 908. The HDD 900 may be connected to memory 909 such as random access memory (RAM), low latency nonvolatile memory such as flash memory, read only memory (ROM) and/or other suitable electronic data storage.

Figure 10B:
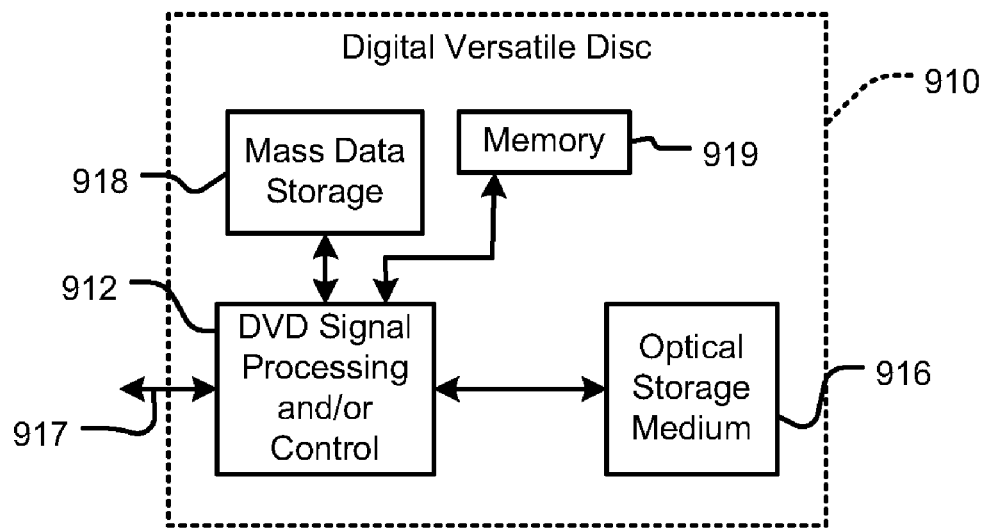

Referring now to FIG. 10B, the present invention can be implemented in a digital versatile disc (DVD) drive 910. The present invention may implement either or both signal processing and/or control circuits, which are generally identified in FIG. 10B at 912, and/or mass data storage 918 of the DVD drive 910. The signal processing and/or control circuit 912 and/or other circuits (not shown) in the DVD 910 may process data, perform coding and/or encryption, perform calculations, and/or format data that is read from and/or data written to an optical storage medium 916. In some implementations, the signal processing and/or control circuit 912 and/or other circuits (not shown) in the DVD 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD 910 may communicate with mass data storage 918 that stores data in a nonvolatile manner. The mass data storage 918 may include a hard disk drive (HDD). The HDD may have the configuration shown in FIG. 10A. The HDD may be a mini HDD that includes one or more platters having a diameter that is smaller than approximately 1.8". The DVD 910 may be connected to memory 919 such as RAM, ROM, low latency nonvolatile memory such as flash memory and/or other suitable electronic data storage.

Figure 10C:
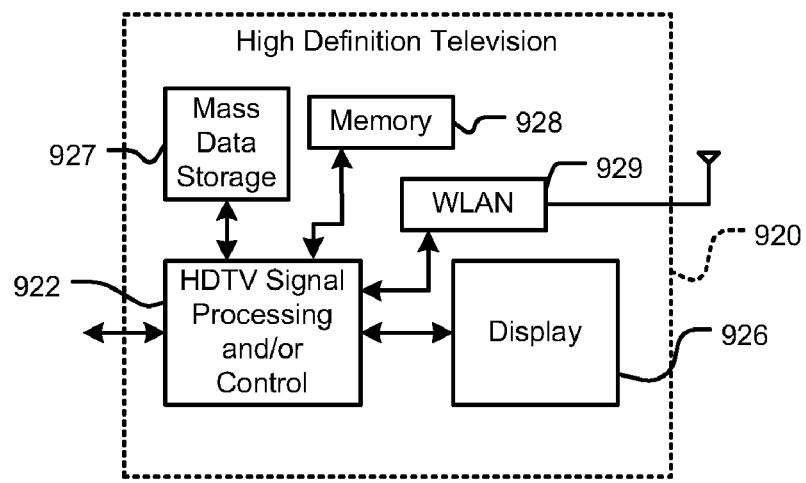

Referring now to FIG. 10C, the present invention can be implemented in a high definition television (HDTV) 920. The present invention may implement either or both signal processing and/or control circuits, which are generally identified in FIG. 10C at 922, a WLAN interface and/or mass data storage of the HDTV 920. The HDTV 920 receives HDTV input signals in either a wired or wireless format and generates HDTV output signals for a display 926. In some implementations, signal processing circuit and/or control circuit 922 and/or other circuits (not shown) of the HDTV 920 may process data, perform coding and/or encryption, perform calculations, format data and/or perform any other type of HDTV processing that may be required.

The HDTV 920 may communicate with mass data storage 927 that stores data in a nonvolatile manner such as optical and/or magnetic storage devices. At least one HDD may have the configuration shown in FIG. 10A and/or at least one DVD may have the configuration shown in FIG. 10B. The HDD may be a mini HDD that includes one or more platters having a diameter that is smaller than approximately 1.8". The HDTV 920 may be connected to memory 928 such as RAM, ROM, low latency nonvolatile memory such as flash memory and/or other suitable electronic data storage. The HDTV 920 also may support connections with a WLAN via a WLAN network interface 929.

Figure 10D:
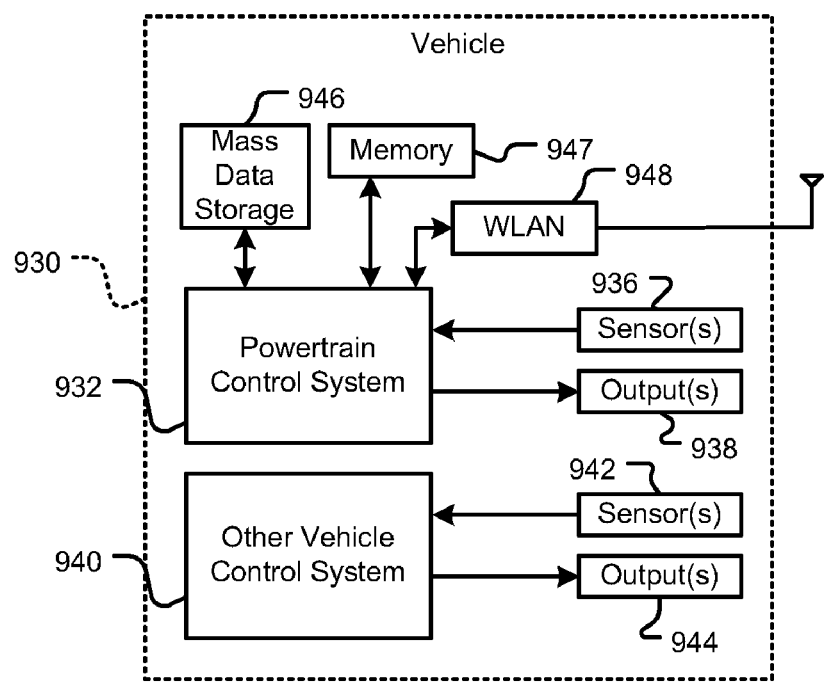

Referring now to FIG. 10D, the present invention can be implemented in a control system of a vehicle 930, a WLAN interface and/or mass data storage of the vehicle control system. In some implementations, the present invention implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 930. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The powertrain control system 932 may be connected to memory 947 such as RAM, ROM, low latency nonvolatile memory such as flash memory and/or other suitable electronic data storage. The powertrain control system 932 also may support connections with a WLAN via a WLAN network interface 948. The control system 940 may also include mass data storage, memory and/or a WLAN interface (all not shown).

Figure 10E:
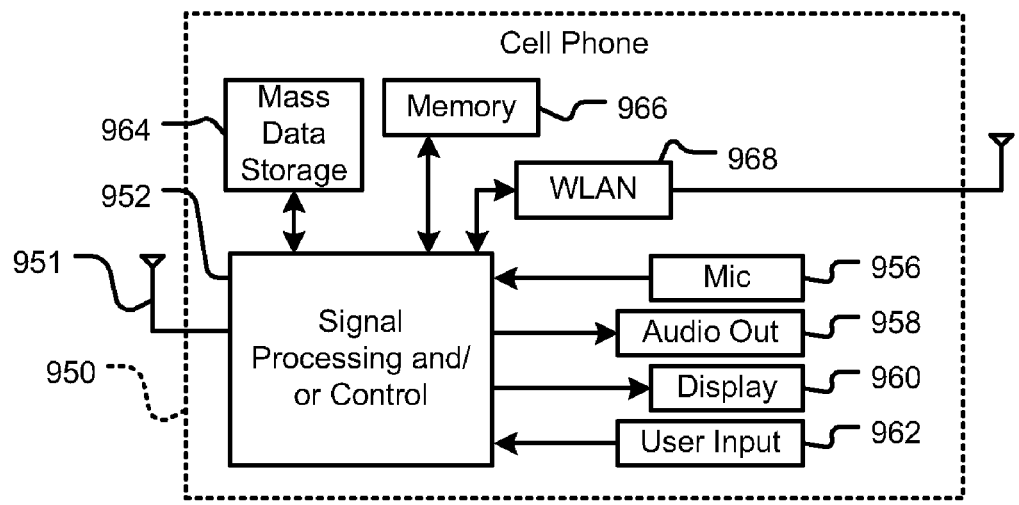

Referring now to FIG. 10E, the present invention can be implemented in a cellular phone 950 that may include a cellular antenna 951. The present invention may implement either or both signal processing and/or control circuits, which are generally identified in FIG. 10E at 952, a WLAN interface and/or mass data storage of the cellular phone 950. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner such as optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The cellular phone 950 may be connected to memory 966 such as RAM, ROM, low latency nonvolatile memory such as flash memory and/or other suitable electronic data storage. The cellular phone 950 also may support connections with a WLAN via a WLAN network interface 968.

Figure 10F:
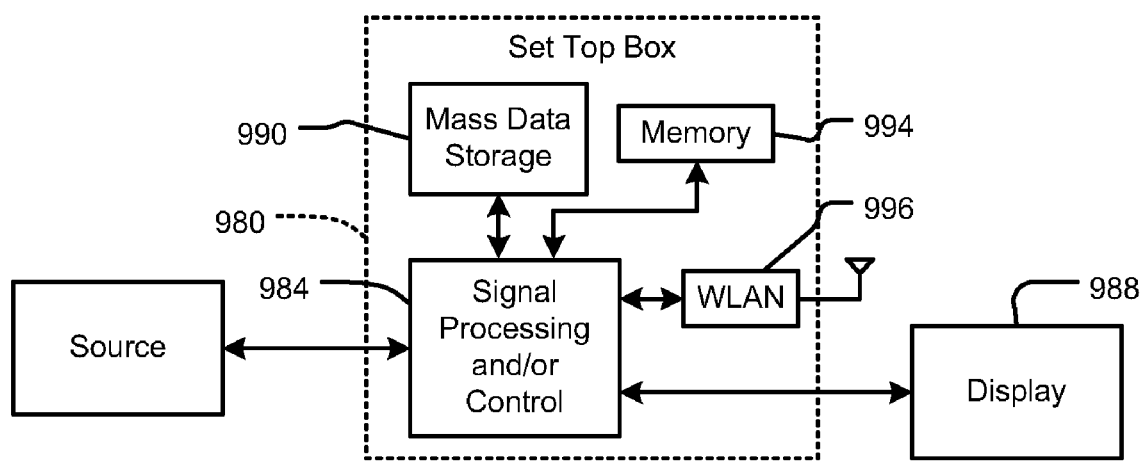

Referring now to FIG. 10F, the present invention can be implemented in a set top box 980. The present invention may implement either or both signal processing and/or control circuits, which are generally identified in FIG. 10F at 984, a WLAN interface and/or mass data storage of the set top box 980. The set top box 980 receives signals from a source such as a broadband source and outputs standard and/or high definition audio/video signals suitable for a display 988 such as a television and/or monitor and/or other video and/or audio output devices. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. The set top box 980 also may support connections with a WLAN via a WLAN network interface 996.

Figure 10G:
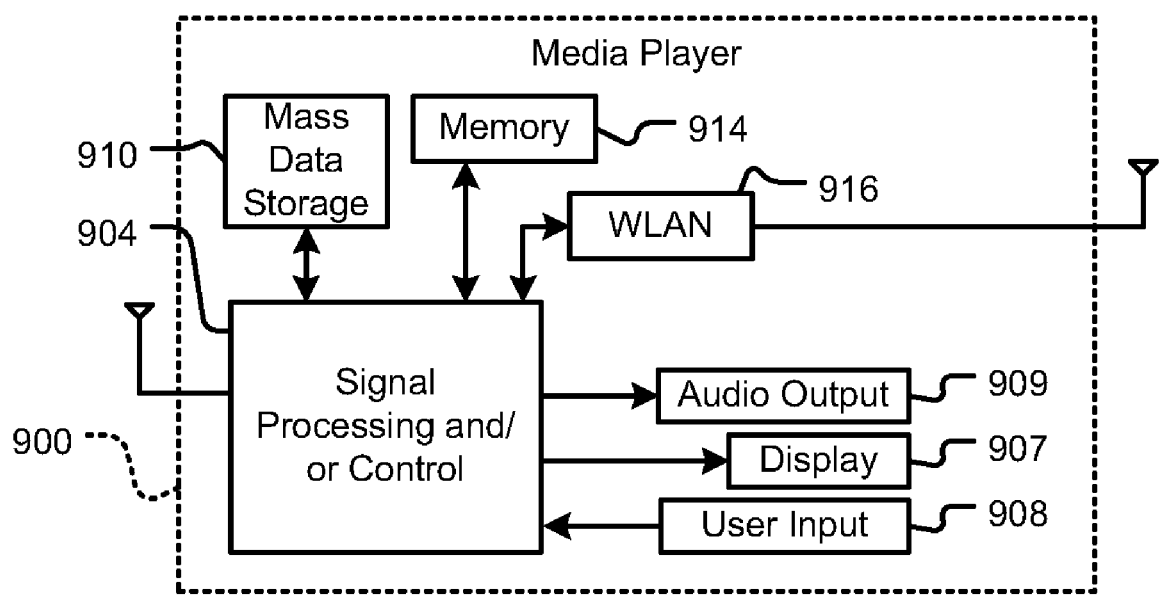

Referring now to FIG. 10G, the present invention can be implemented in a media player 1000. The present invention may implement either or both signal processing and/or control circuits, which are generally identified in FIG. 10G at 1004, a WLAN interface and/or mass data storage of the media player 1000. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The media player 1000 may be connected to memory 1014 such as RAM, ROM, low latency nonvolatile memory such as flash memory and/or other suitable electronic data storage. The media player 1000 also may support connections with a WLAN via a WLAN network interface 1016. Still other implementations in addition to those described above are contemplated.

CONCLUSION

Thus, the present invention provides an interface, arrangement, and method for controlling flash memory devices in multiple device systems without increasing a pin count. In particular, embodiments of the present invention provide a memory controller, as well as methods of programming and reading flash memory devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A system, comprising:
a plurality of NAND flash memory devices each having a NAND flash interface, wherein the NAND flash interface of each NAND flash memory device includes an 8-bit data bus, a Command Latch Enable signal, an Address Latch Enable signal, a Read Enable Signal, a Write Enable Signal, a Write Protect signal, and a Ready/busy signal; and
a memory controller configured to utilize
the 8-bit data bus to exchange data with the plurality of NAND flash memory devices,
the Command Latch Enable signal as a synchronization signal when transmitting commands to the plurality of NAND flash memory devices via the 8-bit data bus,
the Address Latch Enable signal as a clock signal when communicating with the plurality of NAND flash memory devices via the 8-bit data bus,
the Read Enable signal as a read clock signal when reading data from the plurality of NAND flash memory devices via the 8-bit data bus,
the Write Enable signal as a configuration signal when configuring the plurality of NAND flash memory devices via the 8-bit data bus, and
the Ready/busy signal as an interrupt when performing program and erase operations on the plurality of NAND flash memory devices via the 8-bit data bus, and
wherein the memory controller is further configured to
select a first NAND flash memory device of the plurality of NAND flash memory devices, without using a Chip Enable signal of the NAND flash interface, by transmitting, on the 8-bit data bus, an identification byte identifying the first NAND flash memory device, transmit, on the 8-bit data bus, a command byte to the first NAND flash memory device, wherein the first NAND flash memory device is configured to (i) perform an operation indicated by the command byte, and (ii) use the Ready/busy signal to indicate completion of the command to the memory controller, transmit, via the 8-bit data bus, the identification byte and the command byte to the first NAND flash memory device by transitioning the Command Latch Enable signal to a first state, wherein the command byte includes a command to program the first NAND flash memory device, transmit, via the 8-bit data bus, a plurality of parameter bytes and a plurality of data bytes following the identification byte and the command byte to the first NAND flash memory device, and transition the Command Latch Enable signal to a second state to terminate the command to program the first NAND flash memory device, wherein the second state is opposite of the first state, and write the plurality of data bytes to a buffer instead of writing the plurality of data bytes to the first NAND flash memory device in response to (i) the Command Latch Enable signal transitioning to the second state, and (ii) the Ready/busy signal not indicating completion of the command to program within a predetermined number of cycles of the Address Latch Enable signal after the Command Latch Enable signal transitions to the second state.

2. The system of claim 1, wherein memory controller is further configured to transmit, via the 8-bit data bus, to the first NAND flash memory device:

the command byte following the identification byte;

a first number of parameter bytes following the command byte, wherein the parameter bytes specify parameters associated with the command byte, and wherein the first number depends of a type of command included in the command byte; and a second number of data bytes following the first number of parameter bytes, wherein the second number depends of the type of command included in the command byte.

3. The system of claim 1, wherein the memory controller is further configured to;

transmit, via the 8-bit data bus, the identification byte and the command byte to the first NAND flash memory device by transitioning the Command Latch Enable signal to a first state, wherein the command byte includes a command to configure the first NAND flash memory device:

transmit, via the 8-bit data bus, a plurality of authentication bytes following the identification byte and the command byte to the first NAND flash memory device using the Write Enable signal; and transition the Command Latch Enable signal to a second state one cycle prior to transmission of a last one of the plurality of authentication bytes, wherein the second state is opposite of the first state, and wherein the one cycle corresponds to one cycle of the Address Latch Enable signal.

4. The system of claim 3, wherein the memory controller is further configured to transmit the plurality of authentication bytes for up to 16 cycles of the Address Latch Enable signal.

5. The system of claim 1, wherein the memory controller is further configured to:

transmit, via the 8-bit data bus, the identification byte and the command byte to the first NAND flash memory device using, the Command Latch Enable signal, wherein the command byte includes a command to read configuration of the first NAND flash memory device; and receive, via the 8-bit data bus, a plurality of authentication bytes from the first NAND flash memory device using the Read Enable signal.

6. The system of claim 1, wherein the memory controller is further configured to:

transmit, via the 8-bit data bus, the identification byte and the command byte to the first NAND flash memory device using the Command Latch Enable signal, wherein the command byte includes a command to read data from the first NAND flash memory device; and receive, via the 8-bit data bus, a plurality of data bytes from the first NAND flash memory device using the Read Enable signal.

7. A method comprising:

exchanging data with a plurality of NAND flash memory devices, each having a NAND flash interface, via an 8-bit data bus of the NAND flash interface, wherein the NAND flash interface of each NAND flash memory device further comprises a Command Latch Enable signal, an Address Latch Enable signal, a Read Enable Signal, a Write Enable Signal, a Write Protect signal, and a Ready/busy signal;

transmitting commands to the NAND flash memory devices via the 8-bit data bus using the Command Latch Enable signal as synchronization signal;

communicating with the NAND flash memory devices via the 8-bit data bus using the Address Latch Enable signal as a clock signal;

reading data from the NAND flash memory devices via the 8-bit data bus using the Read Enable signal as a read clock signal;

configuring the NAND flash memory devices via the 8-bit data bus using the Write Enable signal as a configuration signal;

performing program and erase operations on the NAND flash memory devices via the 8-bit data bus using the Ready/busy signal as an interrupt signal;

selecting a first NAND flash memory device of the plurality of NAND flash memory devices, without using a Chip Enable signal of the NAND the 8-bit data bus, an identification byte identifying the first NAND flash memory device;

transmitting, on the 8-bit data bus, a command byte on the 8-bit data bus to the first NAND flash memory device;

performing an operation indicated byte the command byte at the first NAND flash memory device;

using Ready/busy signal to indicate completion of the command to a memory controller, wherein the memory controller is configured to control the plurality of NAND flash memory devices via the NAND flash interface;

transmitting, via the 8-bit data bus, the identification byte and the command byte to the first NAND flash memory device by transitioning the Command Latch Enable signal to a first state, wherein the command byte includes a command to program the first NAND flash memory device;

transmitting, via the 8-bit data bus, a plurality of parameter bytes and a plurality of data byte, following the identification byte and the command byte to the first NAND flash memory device;

transitioning the Command Latch Enable signal to a second state, which is opposite of the first state, to terminate the command to program the first NAND flash memory device; and buffering the plurality of data bytes instead of writing the plurality of data bytes to the one of the NAND flash memory devices in response to (i) the Command Latch Enable signal transitioning to the second state (ii) the Ready/busy signal not indicating completion of the command to program within a predetermined number of cycles of the Address Latch Enable signal after the Command Latch Enable signal transitions to the second state.

8. The method of claim 7, further comprising transmitting, via the 8-bit data bus, to the first NAND flash memory device:
   the command byte following the identification byte;
   a first number of parameter bytes following the command byte, wherein the parameter bytes specify parameters associated with the command byte, and wherein the first number depends of a type of command included in the command byte; and
   a second number of data bytes following the first number of parameter bytes, wherein the second number depends of the type of command included in the command byte.

9. The method of claim 7, further comprising:
   transmitting, via the 8-bit data bus, the identification byte and the command byte to the first NAND flash memory device by transitioning the Command Latch Enable signal to a first state, wherein the command byte includes a command to configure the one of the NAND flash memory devices;
   transmitting, via the 8-bit data bus, a plurality of authentication bytes following the identification byte and the command byte to the first NAND flash memory device using the Write Enable signal; and
   transitioning the Command Latch Enable signal to a second state one cycle prior to transmission of a last one of the plurality of authentication bytes, wherein the second state is opposite of the first state, and wherein the one cycle corresponds to one cycle of the Address Latch Enable signal.

10. The method of claim 9, further comprising transmitting the plurality of authentication bytes for up to 16 cycles of the Address Latch Enable signal.

11. The method of claim 7, further comprising:
    transmitting, via the 8-bit data bus, the identification byte and the command byte to the first NAND flash memory device using the Command Latch Enable signal, wherein the command byte includes a command to read configuration of the first NAND flash memory device; and
    receiving, via the 8-bit data bus, a plurality of authentication bytes from the first NAND flash memory device using the Read Enable signal.

12. The method of claim 7, further comprising;
    transmitting, via the 8-bit data bus, the identification byte and the command byte to the first NAND flash memory device using the Command Latch Enable signal, wherein the command byte includes a command to read data from the first NAND flash memory device; and
    receiving, via the 8-bit data bus, a plurality of data bytes from the first NAND flash memory device using the Read Enable signal.

* * * * *